(12) United States Patent
Aizawa et al.

(10) Patent No.: US 10,293,369 B2
(45) Date of Patent: May 21, 2019

(54) LIGHT EMITTING DEVICE AND LIGHT IRRADIATION APPARATUS INCLUDING THE SAME

(71) Applicant: NICHIA CORPORATION, Anan-shi (JP)

(72) Inventors: Toshihiko Aizawa, Anan (JP); Masato Ono, Sagamihara (JP); Daisuke Kishikawa, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/854,763

(22) Filed: Dec. 27, 2017

(65) Prior Publication Data

US 2018/0178247 A1  Jun. 28, 2018

(30) Foreign Application Priority Data

Dec. 27, 2016  (JP) .................. 2016-253815

(51) Int. Cl.
  *B05D 3/06*  (2006.01)
  *H01L 25/075*  (2006.01)
  (Continued)

(52) U.S. Cl.
  CPC .............. *B05D 3/067* (2013.01); *F21V 5/007* (2013.01); *F21V 5/043* (2013.01); *H01L 25/0753* (2013.01); *H01L 33/62* (2013.01); *F21Y 2105/16* (2016.08); *F21Y 2115/10* (2016.08); *H01L 33/46* (2013.01); *H01L 33/54* (2013.01); *H01L 33/58* (2013.01)

(58) Field of Classification Search
  CPC ...... F21V 5/007; F21V 5/043; H01L 25/0753; F21Y 2105/16
  USPC ........................ 362/311.02, 249.02
  See application file for complete search history.

(56) References Cited

U.S. PATENT DOCUMENTS

2003/0137828 A1*  7/2003  Ter-Hovhannisian ...................... A47F 3/001
                                                                  362/92
2006/0055309 A1    3/2006  Ono et al.
                    (Continued)

FOREIGN PATENT DOCUMENTS

JP  63-276287    11/1988
JP  2006-086191   3/2006
                (Continued)

*Primary Examiner* — Laura K Tso
(74) *Attorney, Agent, or Firm* — Mori & Ward, LLP

(57) ABSTRACT

A light emitting device is provided which includes a printed board, light emitting elements, and a light-transmissive member. The light emitting elements are arranged in three or more rows, and mounted on the printed board. The light-transmissive member includes three or more semi-semi-cylindrical lens portions that are arranged side by side transversely to cover the three or more rows. The heights of the tops of the semi-cylindrical lens portions are substantially equal to each other. The semi-cylindrical lens portions include first semi-cylindrical lens portions which are arranged to cover at least the both end rows, and a second semi-cylindrical lens portion which is arranged on the interior sides relative to the first semi-cylindrical lens portions in the transverse direction. The radius of curvature of the second semi-cylindrical lens portion is smaller than the first semi-cylindrical lens portions.

19 Claims, 12 Drawing Sheets

(51) Int. Cl.
*H01L 33/62* (2010.01)
*F21V 5/00* (2018.01)
*F21V 5/04* (2006.01)
*H01L 33/58* (2010.01)
*F21Y 115/10* (2016.01)
*F21Y 105/16* (2016.01)
*H01L 33/46* (2010.01)
*H01L 33/54* (2010.01)

(56) References Cited

U.S. PATENT DOCUMENTS

| | | | |
|---|---|---|---|
| 2014/0293264 A1 | 10/2014 | Miyazaki | |
| 2017/0154920 A1* | 6/2017 | Ono | H01L 27/156 |
| 2017/0314764 A1* | 11/2017 | Kishikawa | F21V 5/007 |
| 2018/0149336 A1* | 5/2018 | Tsai | F21V 5/007 |

FOREIGN PATENT DOCUMENTS

| | | |
|---|---|---|
| JP | 2007-106113 | 4/2007 |
| JP | 2008-047569 | 2/2008 |
| JP | 2008-203430 | 9/2008 |
| JP | 2010-117531 | 5/2010 |
| JP | 2013-065773 | 4/2013 |
| JP | 2013-244727 | 12/2013 |
| JP | 2014-209078 | 11/2014 |
| JP | 2015-022989 | 2/2015 |
| JP | 2015-167512 | 9/2015 |
| JP | 2016-146452 | 8/2016 |

* cited by examiner

LIGHT EMITTING DEVICE AND LIGHT IRRADIATION APPARATUS INCLUDING THE SAME

CROSS-REFERENCE TO RELATED APPLICATIONS

The present application claims priority under 35 U. S. C. § 119 to Japanese Patent Application No. 2016-253,815 filed on Dec. 27, 2016. The contents of this application are incorporated herein by reference in their entirety.

BACKGROUND OF THE INVENTION

1. Field of the Invention

The present disclosure relates to a light emitting device, and a light irradiation apparatus which includes the light emitting devices.

2. Description of the Related Art

A COB (Chip On Board) type of light emitting device is known which includes light emitting diodes (hereinafter, also referred to as LEDs) as light emitting elements. For example, a light emitting device is known which includes light emitting elements mounted on a printed board, and a light-transmissive sealing member which has semi-semi-cylindrical lens portions connected to each other. Each of the semi-semi-cylindrical lens portions covers corresponding one of rows of light emitting elements. Each row includes two or more of the light emitting elements.

This type of light emitting device can include light emitting elements which can emit light in the ultraviolet range, for example. In this case, the light emitting device can be used as a light irradiation apparatus for resin curing and for printing. Typically, this type of light irradiation apparatus irradiates a target object (e.g., ink or resin) with uniform and strong ultraviolet light whereby curing the target object to be irradiated. Hereinafter, light in the ultraviolet range is occasionally referred to as ultraviolet light.

However, if ink, resin, or the like is irradiated with such strong ultraviolet light in a short time as stated above, only its surface part may be cured. In this case, the inside part of the ink, resin, or the like will be not sufficiently cured.

It is one of objects of the present invention to provide a light emitting device which includes a light-transmissive member having semi-cylindrical lens portions arranged side by side transversely, and can reduce the maximum slope of the light-intensity-distribution curve of the light emitting device in the transverse direction. It is another object to provide a light irradiation device which can smoothly distribute the intensity of light with which a target object is irradiated.

SUMMARY OF THE INVENTION

A light emitting device according to an aspect of the present invention includes a printed board, light emitting elements, and a light-transmissive member. The light emitting elements are arranged in three or more light-emitting-element rows, and mounted on the printed board. The light-transmissive member includes three or more semi-cylindrical lens portions that are arranged side by side transversely to cover the three or more light-emitting-element rows. The semi-cylindrical lens portions have a convex shape which bulges toward the upper surface side as viewed in transverse cross-section. The heights of the tops of the semi-cylindrical lens portions are substantially equal to each other. The semi-cylindrical lens portions include first semi-cylindrical lens portions which are arranged to cover the light emitting elements at least in the both end rows, and a second semi-cylindrical lens portion(s) which is/are arranged on the interior sides relative to the first semi-cylindrical lens portions in the transverse direction. The radius of curvature of the second semi-cylindrical lens portion(s) is smaller than the first semi-cylindrical lens portions.

A light irradiation apparatus according to another aspect of the present invention includes a plurality of the aforementioned light emitting devices whereby irradiating a target object with light which is emitted by the light emitting devices. The light emitting devices are arranged in the transverse direction. The relative movement direction between the plurality of light emitting devices and the target object is parallel to the transverse arrangement direction of the semi-cylindrical lens portions.

According to the aforementioned light emitting device which includes a light-transmissive member having semi-cylindrical lens portions arranged side by side transversely, the maximum slope of the light-intensity-distribution curve of the light emitting device in the transverse direction can be reduced. According to the aforementioned light irradiation device, the intensity of light with which a target object is irradiated can be smoothly distributed, and as a result the target object can be prevented from irradiation of strong light in a short time.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Figure 1:
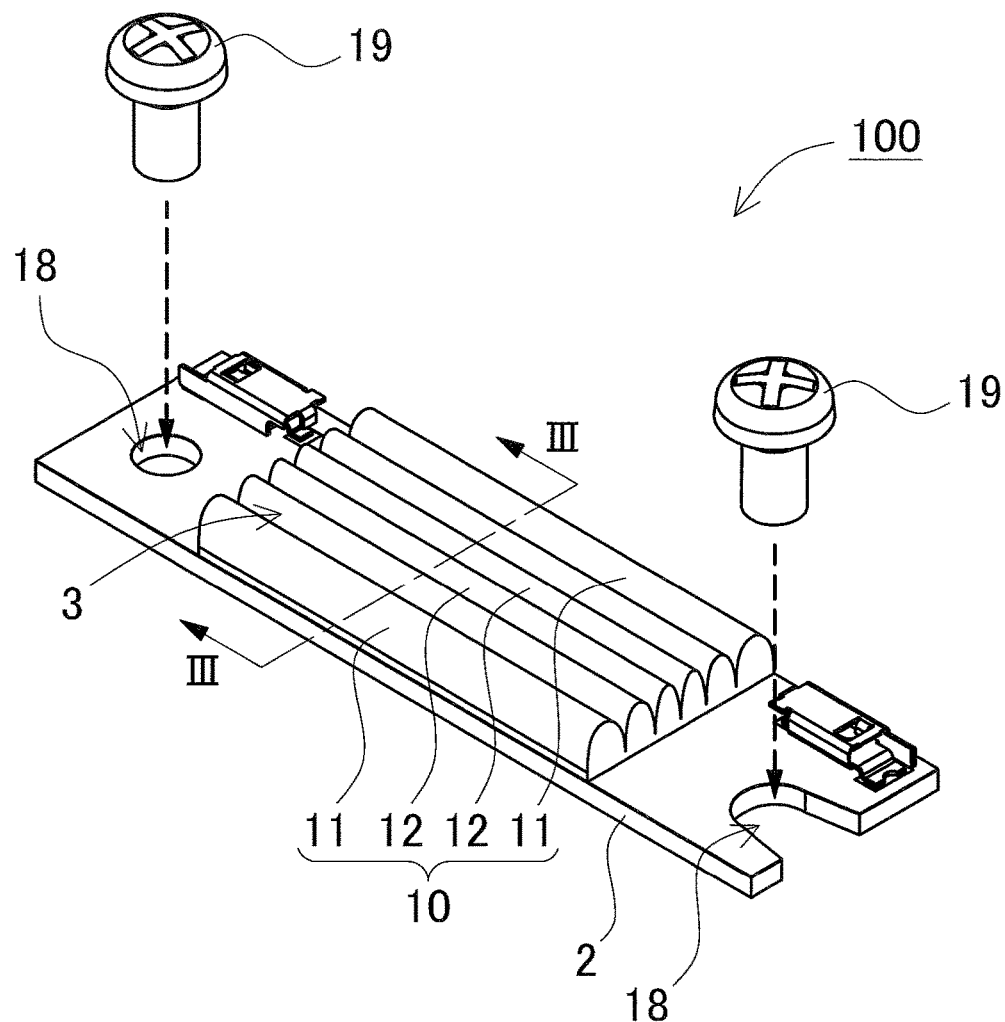
FIG. 1 is a perspective view schematically showing a light emitting device according to a first embodiment.

The embodiments will now be described with reference to the accompanying drawings, wherein like reference numerals designate corresponding or identical elements throughout the various drawings.

It should be appreciated, however, that the embodiments described below are illustrations of a light emitting device and a light irradiation device to give a concrete form to technical ideas of the invention, and a light emitting device and a light irradiation device of the invention are not specifically limited to description below. Additionally, the dimensions, the shapes and the arrangement relationships of the members in each of the drawings are occasionally shown larger exaggeratingly for ease of explanation. Members same as or similar to those of this invention are attached with the same designation and the same reference numerals in principle, and their description is omitted. The parts, and the like described in the embodiments can be suitably combined with each other.

First Embodiment

Figure 2:
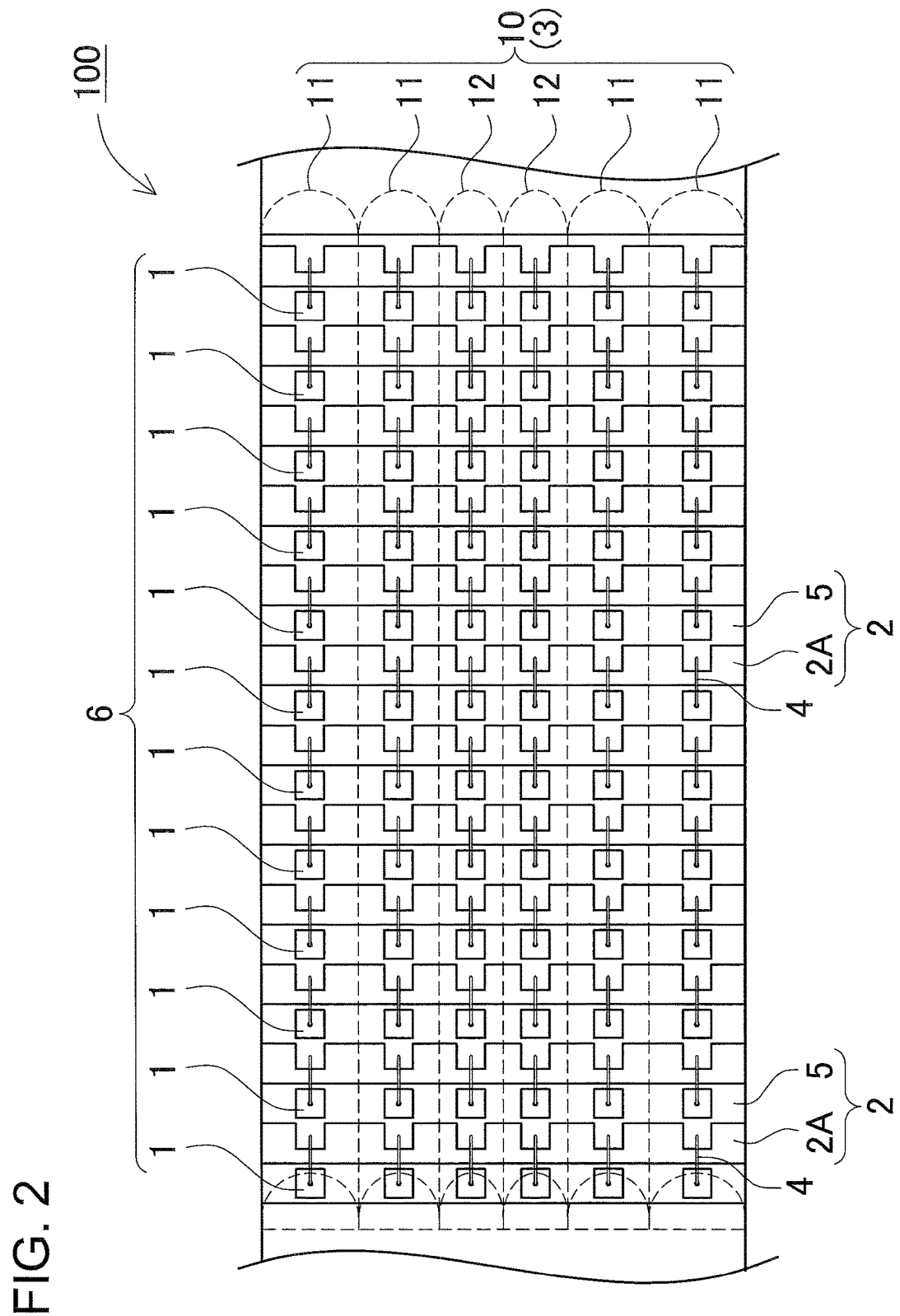
FIG. 2 is a plan view schematically showing the arrangement of light emitting elements of the light emitting device shown in FIG. 1.
Figure 3:
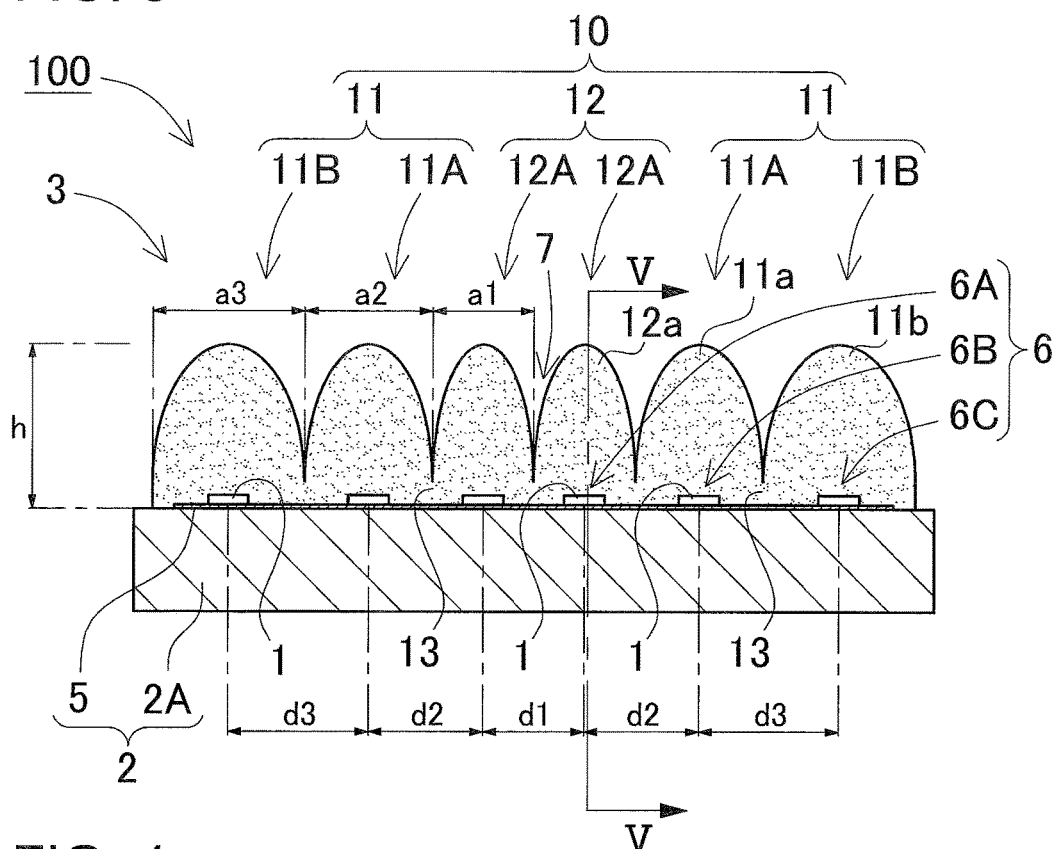
FIG. 3 is a cross-sectional view schematically showing the light emitting device shown in FIG. 1 taken along the line III-III.
Figure 4:
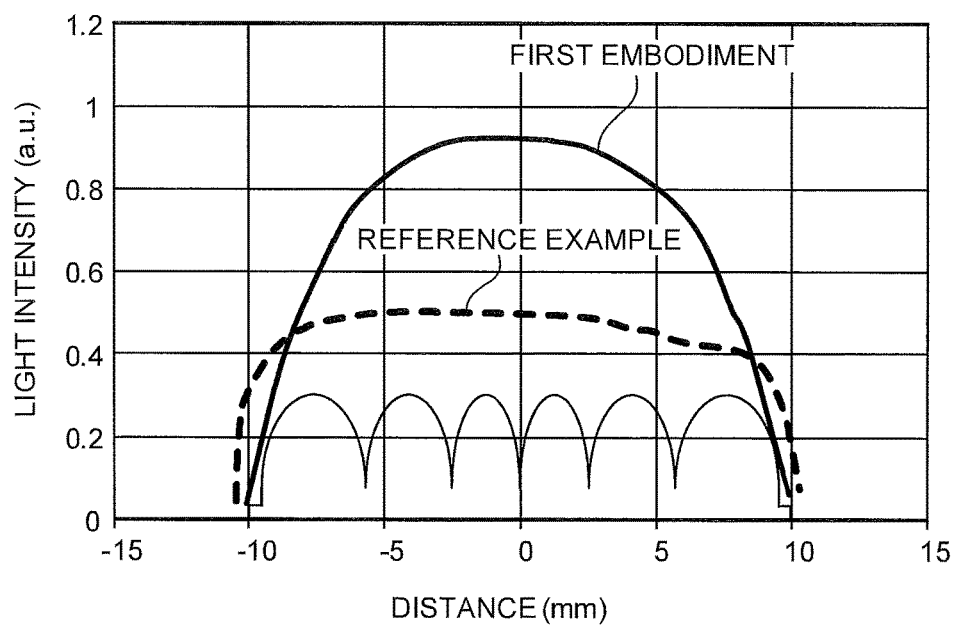
FIG. 4 is a graph showing the light-intensity-distribution curve of the light emitting device shown in the schematic cross-sectional view of FIG. 3.
Figure 5:
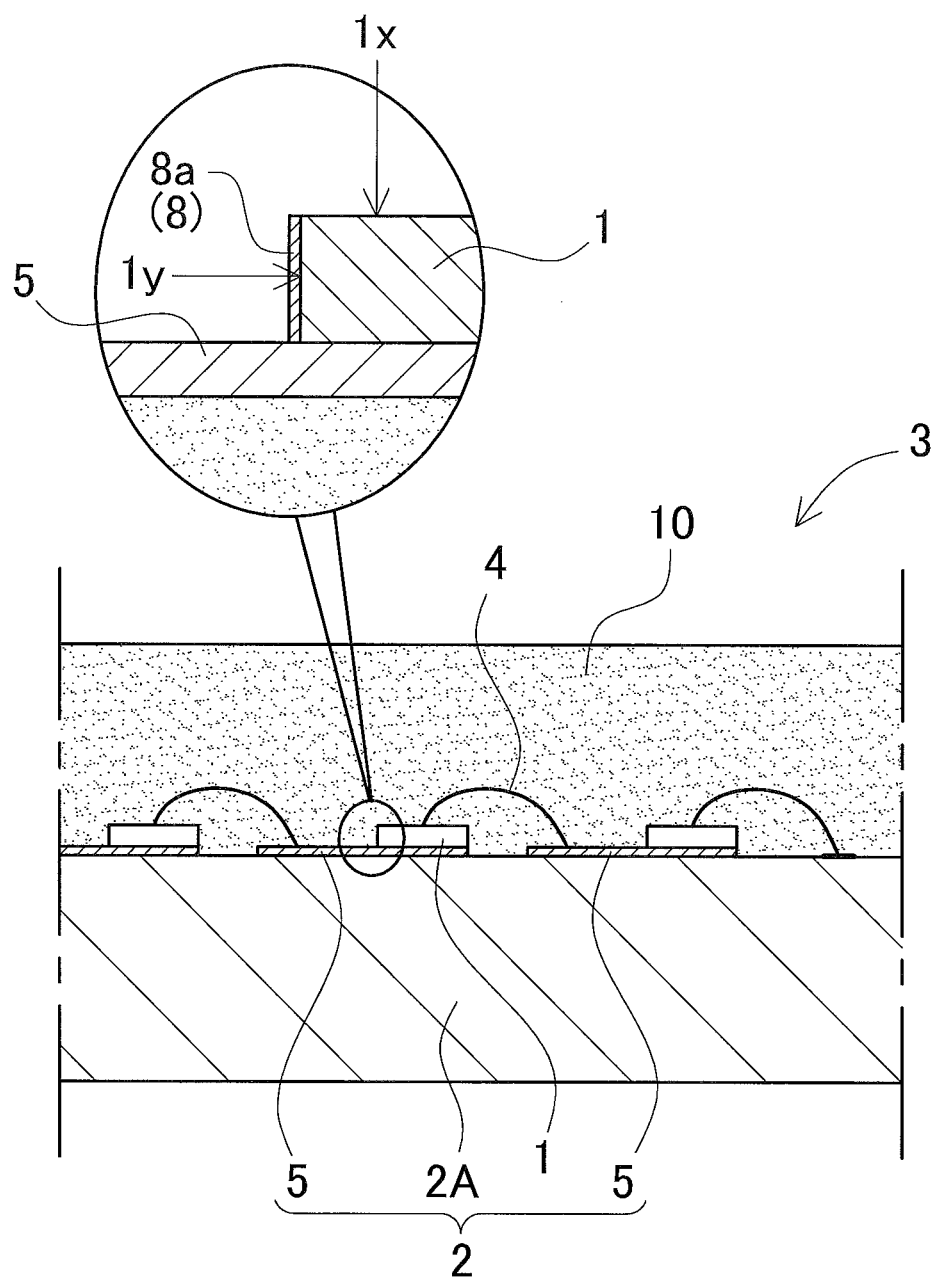
FIG. 5 shows cross-sectional and partially enlarged cross-sectional views schematically showing the light emitting device shown in FIG. 3 taken along the line V-V.

A light emitting device 100 according to a first embodiment of the present invention is shown in FIGS. 1 to 5. FIG. 1 is a perspective view schematically showing the light emitting device 100 according to the first embodiment. FIG. 2 is a plan view schematically showing the arrangement of light emitting elements 1 of the light emitting device 100 shown in FIG. 1. FIG. 3 is a cross-sectional view schematically showing the light emitting device 100 shown in FIG. 1 taken along the line III-III. FIG. 4 is a graph showing the light-intensity-distribution curve of the light emitting device 100 shown in the schematic cross-sectional view of FIG. 3. FIG. 5 shows cross-sectional and partially enlarged cross-sectional views schematically showing the light emitting device 100 shown in FIG. 3 taken along the line V-V.

The light emitting device 100 includes a printed board 2, the light emitting elements 1, and a light-transmissive member 3. The light emitting elements 1 can be arranged in three or more light-emitting-element rows 6, and mounted on the printed board 2. The light-transmissive member 3 can include three or more semi-cylindrical lens portions 10 which are arranged parallel to each other to cover the three or more light-emitting-element rows 6. Specifically, in the light emitting device 100, the light emitting elements 1 are arranged in six light-emitting-element rows 6 on the printed board 2. The six light-emitting-element rows 6 are spaced at predetermined intervals away from each other. Correspondingly, six semi-cylindrical lens portions 10 of the light-transmissive member 3 are arranged side by side transversely in parallel to each other on the light-emitting-element rows 6.

The semi-cylindrical lens portions 10 include first semi-cylindrical lens portions 11 which are arranged to cover the light emitting elements 1 at least in the both end rows, and second semi-cylindrical lens portions 12 which are arranged on the interior sides relative to the first semi-cylindrical lens portions 11 in the transverse (parallel arrangement) direction of the semi-cylindrical lens portions 10. The first and second semi-cylindrical lens portions 11 and 12 have different transverse cross-sectional shapes. The radius of curvature of a curved part 12a on the upper surface side of the second semi-cylindrical lens portion 12 is smaller than the radii of curvature of curved parts 11a and 11b on the upper surface side of the first semi-cylindrical lens portions 11. The first semi-cylindrical lens portions 11 include first semi-cylindrical lens portions 11A which are arranged to cover the light emitting elements in the second outermost rows, and first semi-cylindrical lens portions 11B which are arranged to cover the light emitting elements in the outermost rows. The radius of curvature becomes smaller in the order of the curved part 11b on the upper surface side of the first semi-cylindrical lens portion 11B, the curved part 11a on the upper surface side of the first semi-cylindrical lens portion 11A, and the curved part 12a on the upper surface side of the second semi-cylindrical lens portion 12A.

The curved parts 11a and 11b of the first semi-cylindrical lens portions 11, and the curved part 12a of the second semi-cylindrical lens portion 12, which are included on the upper surface side in the semi-cylindrical lens portions 10, have a convex shape as viewed in transverse cross-section. The heights (h) of the tops of all the semi-cylindrical lens portions 10 are substantially equal to each other. In this specification, the term "the heights (h) of the tops of all the semi-cylindrical lens portions 10 are substantially equal to each other" includes that the difference between the heights (h) of the tops of the semi-cylindrical lens portions falls within one fifth of the entire height (h) of the light-transmissive member or within a small range not greater than the difference from 0.2 to 1.0 mm. In addition, in this specification, the transverse cross-section of the semi-cylindrical lens portion 10 refers to a cross-section of the semi-cylindrical lens portion as viewed in the direction perpendicular to the extension direction of the semi-cylindrical lens portion. The extension direction of the semi-cylindrical lens portion is defined as the longitudinal direction of the semi-cylindrical lens portion in plan view. The width (a) of the semi-cylindrical lens portion 10 falls within the range from 0.2 to 2.0 times, preferably 0.25 to 1.5 times, more preferably 0.3 to 1.0 time the height (h) of the semi-cylindrical lens portion 10.

In this embodiment, the first semi-cylindrical lens portions 11 are semi-cylindrical lens portions which are arranged to cover the light emitting elements in the both end rows (outermost rows in the parallel arrangement direction of the semi-cylindrical lens portions 10) and the rows (second outermost rows) adjacent to the both end rows (totally in these four rows), and the second semi-cylindrical lens portions 12 are semi-cylindrical lens portions which are arranged to cover the light emitting elements in the two central rows, which are located on the interior sides of the first semi-cylindrical lens portions 11, and have the curved part 12a with a radius of curvature smaller than the curved parts 11a and 11b of the first semi-cylindrical lens portions 11, which are located on the exterior sides of the second semi-cylindrical lens portions 12. This light-transmissive member 3 can improve the effect of gathering light from the light-emitting-element rows to lines in front of the central rows in the transverse direction as compared with a light emitting device which includes a light-transmissive member including semi-cylindrical lens portions which are arranged side by side transversely and have a top curved part with a fixed radius of curvature. As a result, the light emitting device according to this embodiment can reduce the maximum slope of the light-intensity-distribution curve of the light emitting device in the transverse direction of the semi-cylindrical lens portions. In other words, in the case where a light emitting device includes a light-transmissive member including semi-cylindrical lens portions which are arranged side by side transversely and have a top curved part with a fixed radius of curvature, the semi-cylindrical lens portion in the both end rows will irradiate a target object with too strong light in a short time, or the intensity of light which is emitted from the central semi-cylindrical lens portions to irradiate the target object will be insufficient if the light intensity from the semi-cylindrical lens portions in the both end rows is suppressed. Contrary to this, according to the light emitting device 100, since the curvature of the second semi-cylindrical lens portion 12 is different from the first semi-cylindrical lens portion 11, the target object can be prevented from irradiation of strong light in a short time without suppression of the intensity of light.

The components of the light emitting device 100 will be described.

(Light-Transmissive Member 3)

The light-transmissive member 3 seals the light emitting elements 1, which are arranged on the printed board 2. The light-transmissive member 3 protects the light emitting elements 1 from dust and stress from the outside, and adjusts the light distribution of the light emitting device to a desired light distribution property. The three or more semi-cylindrical lens portions 10 of the light-transmissive member 3 are coupled to each other by connection parts 13 which are located on the lower end side (printed board side) so that trough parts 7 are formed between the semi-cylindrical lens portions 10 adjacent to each other. The semi-cylindrical lens portions 10 are arranged side by side transversely (i.e., in the direction perpendicular to the extension direction of the semi-cylindrical lens portion 10) as viewed in plan view. In the case where these semi-cylindrical lens portions 10 are integrally formed by connecting them to each other by the connection parts 13, the light-intensity-distribution curve of the light emitting device can be relatively smooth as compared with the case where the semi-cylindrical lens portions 10 are separated from each other. The light-transmissive member may include flange parts which extend outward from the lower ends of the semi-cylindrical lens portions in addition to the semi-cylindrical lens portions.

The semi-cylindrical lens portion 10 forms a planoconvex lens which includes a cylindrical surface as its upper surface, and a flat surface as its lower surface. The transverse cross-sectional shape of the semi-cylindrical lens portion 10 can be a substantially semi-elliptic shape or substantially semicircular shape the central part of which is bulges upward. The semi-cylindrical lens portion 10 according to this embodiment has a substantially semi-elliptic shape in transverse cross-section. The minor axis of the semi-elliptic shape corresponds to the flat surface. The height (h) of the semi-cylindrical lens portion 10 extends in the major axis direction of the semi-elliptic shape. The major axis direction of the semi-elliptic shape agrees with the optical axes of the light emitting elements 1. The semi-cylindrical lens portions 10 have a transverse cross-sectional shape symmetric with respect to the optical axes of the light emitting elements 1 which face their corresponding semi-cylindrical lens portions 10.

The semi-cylindrical lens portions 10 of the light-transmissive member 3 are arranged on the printed board 2 to cover their corresponding light-emitting-element rows 6 in which the light emitting elements 1 are aligned. At least three or more light-emitting-element rows 6 are arranged on the printed board 2. Correspondingly, at least three or more semi-cylindrical lens portions 10 are provided. The top of the convex semi-cylindrical lens portion 10 is arranged above substantially the centers of the light emitting surfaces of the light emitting elements 1.

The semi-cylindrical lens portions 10 of the light-transmissive member 3 have a fixed height (h). In order to provide a desired distribution property of light which passes the light-transmissive member 3 after emitted by light emitting elements 1, the semi-cylindrical lens portions 10 have different transverse cross-sectional shapes, that is, the first and second semi-cylindrical lens portions 11 and 12 are included. At least the both transverse end semi-cylindrical lens portions 10 (outermost semi-cylindrical lens portions) of the light-transmissive member 3 serve as the first semi-cylindrical lens portions 11 are arranged. The second semi-cylindrical lens portions 12 are arranged on the interior sides relative to the first semi-cylindrical lens portions 11. The radius of curvature of the curved part 12a on the upper surface side of the second semi-cylindrical lens portion 12 is smaller than the radii of curvature of the curved parts 11a and 11b on the upper surface side of the first semi-cylindrical lens portions 11. Since the radius of curvature of the curved part 12a on the upper surface side of the second semi-cylindrical lens portion 12 is smaller so that the second semi-cylindrical lens portion 12 has a higher light-gathering effect, the directivity of light from the second semi-cylindrical lens portion 12 can be higher than the curved parts 11a and 11b on the upper surface side of the first semi-cylindrical lens portions 11.

The directivity of light emitted by the light emitting elements 1 can be adjusted by adjusting the radii of curvature of the curved parts 11a, 11b, and 12a of the semi-cylindrical lens portions 10, which have convex upper surfaces. The width (a) on the lower surface side of the second semi-cylindrical lens portion 12 is dimensioned small, while the semi-cylindrical lens portions 10, which have substantially semi-elliptic transverse cross-sectional shapes, have the fixed height (h), so that the radius of curvature of the second semi-cylindrical lens portion 12 is dimensioned smaller than the first semi-cylindrical lens portions 11. In other words, the widths (a) of the semi-cylindrical lens portions 10 are adjusted to different widths while the height (h) of the semi-cylindrical lens portions 10 is fixed so that the radii of curvature of the curved parts 11a, 11 b, and 12a can be adjusted to different radii. Specifically, in the light-transmissive member 3 according to this embodiment, the width (a1) of the second semi-cylindrical lens portion 12A is smaller than the widths (a2, a3) of the first semi-cylindrical lens portions 11A and 11B. That is, the width (a1) of the second semi-cylindrical lens portion 12A is the smallest among the semi-cylindrical lens portions 10. Since the width (a1) of the second semi-cylindrical lens portion 12A, which is arranged in the central part, is dimensioned the smallest in the light-transmissive member 3, which includes the semi-cylindrical lens portions 10 arranged side by side transversely, in other words, the radius of curvature on the upper surface side of the curved part 12a is dimensioned the smallest, the directivity of light from the central part can be high.

The second semi-cylindrical lens portion(s) 12 is/are preferably arranged to cover the light emitting elements in the row(s) in the central part in the parallel arrangement direction of the semi-cylindrical lens portions 10. The term "central part" refers to the area which falls within the range from 20 to 80, preferably 40 to 60 where the entire transverse length (entire width) of the semi-cylindrical lens portions 10 is defined 100 and one end is defined zero while another end is defined 100 in the transverse direction.

Specifically, in the case where the number of the semi-cylindrical lens portions 10 is three, the term "the second semi-cylindrical lens portion(s) is/are arranged to cover the light emitting elements in the row(s) in the central part in the transverse directions" means that the second semi-cylindrical lens portion is the central semi-cylindrical lens portion. In the case where the number of the semi-cylindrical lens portions 10 is an odd number not smaller than five, the second semi-cylindrical lens portion(s) which is/are arranged to cover the light emitting elements in the row(s) in the central part in the transverse directions can be not only the central semi-cylindrical lens portion but also be the central semi-cylindrical lens portion and at least one of the two semi-cylindrical lens portions adjacent to the central semi-cylindrical lens portion. In the case where the number of the semi-cylindrical lens portions 10 is four, the term "the second semi-cylindrical lens portion(s) is/are arranged to cover the light emitting elements in the row(s) in the central part in the transverse directions" means that the second semi-cylindrical lens portions are the central two semi-cylindrical lens portions which form the central trough. In the case where the number of the semi-cylindrical lens portions 10 is an even number not smaller than six, the second semi-cylindrical lens portion(s) which is/are arranged to cover the light emitting elements in the row(s) in the central part in the transverse directions can be not only the central two semi-cylindrical lens portions which form the central trough but also be the central two semi-cylindrical lens portions and at least one of the two semi-cylindrical lens portions adjacent to the central two semi-cylindrical lens portion. Since the aforementioned high directive second semi-cylindrical lens portion(s) 12 is/are arranged in the central part, the light intensity can be high in the central part of the light-intensity-distribution curve of the light emitting device 100. In the case where the number of the semi-cylindrical lens portions 10 is an odd number not smaller than three, the center line in the transverse direction (the parallel arrangement direction of the semi-cylindrical lens portions 10) refers to the center line of the central semi-cylindrical lens portion. In the case where the number of the semi-cylindrical lens portions 10 is an even number not smaller than four, the center line in the transverse direction refers to the center line of the central trough part 7 which is formed by the central two semi-cylindrical lens portions.

The light-transmissive member 3 according to this embodiment consists of six semi-cylindrical lens portions 10. The semi-cylindrical lens portions which are arranged to cover the light emitting elements in the outermost rows and the second outermost rows (totally outer four rows) serve as the first semi-cylindrical lens portions 11. The second semi-cylindrical lens portions 12 are arranged to cover the light emitting elements in the other inside two rows, in other words, to cover the light emitting elements in the other two rows which form the trough part 7 which is located on the center line of the entire arrangement of the semi-cylindrical lens portions 10. The radius of curvature of the curved part 12a on the upper surface of the second semi-cylindrical lens portion 12 is the smallest among the semi-cylindrical lens portions 10.

In the light-transmissive member 3 according to this embodiment, the width (a1) of the second semi-cylindrical lens portion 12A is the smallest, and the width (a3) of the first semi-cylindrical lens portion 11B on the transverse ends is the largest. The widths (a) of the semi-cylindrical lens portions increment from the second semi-cylindrical lens portion 12A toward the exterior side (transverse end) so that the widths (a2, a3) of the first semi-cylindrical lens portions 11A and 11B become greater from the second semi-cylindrical lens portion 12A toward the exterior side. The widths (a) of the first semi-cylindrical lens portions 11 and the second semi-cylindrical lens portion 12 can be suitably dimensioned in accordance with a desired light distribution property, the dimensions of the light emitting elements 1, the interval of the light-emitting-element rows 6, and the like. For example, the first and second semi-cylindrical lens portions 11 and 12 preferably have a fixed height (h) within the range from 1.0 to 4.0 mm, and different widths (a) within the range from 2.0 to 10.0 mm. The entire width of the six semi-cylindrical lens portions 10 preferably falls within the range from 10 to 60 mm.

The widths (a) of the semi-cylindrical lens portions 10 can be dimensioned so as to increment from the second semi-cylindrical lens portion 12 toward the exterior sides by a magnification from 1.1 to 2.0 times, preferably from 1.2 to 1.5 times. Specifically, the width (a2) of the first semi-cylindrical lens portion 11A can be 1.1 to 2.0 times, preferably 1.2 to 1.5 times the width (a1) of the second semi-cylindrical lens portion 12A, and the width (a3) of the first semi-cylindrical lens portion 11B can be 1.1 to 2.0 times, preferably 1.2 to 1.5 times the width (a2) of the first semi-cylindrical lens portion 11A. According to this arrangement, the maximum slope of the light-intensity-distribution curve of the light emitting device 100 can be reduced, and the light intensity can be high in the central part of the light-intensity-distribution curve as compared with the light-intensity-distribution curve of a conventional light emitting device which includes a light-transmissive member including semi-cylindrical lens portions which are arranged side by side transversely and has the same transverse cross-sectional shape.

The light-intensity-distribution curves of the light emitting device according to the first embodiment, and a light emitting device according to a reference example are shown by a solid line, and a dashed line in the graph of FIG. 4, respectively. Specifically, the solid line in the graph of FIG. 4 shows the light-intensity-distribution curve of the light emitting device 100 which includes the light emitting elements 1 having a size of 1.4×1.4 mm in plan view and a thickness of 0.3 mm, and the light-transmissive member 3 including the semi-cylindrical lens portion 10 having substantially semi-elliptic shapes in transverse cross-section with a fixed height (h) of 3.0 mm. In this light-transmissive member 3, the width (a2) of the first semi-cylindrical lens portion 11A is 1.25 times the width (a1) of the second semi-cylindrical lens portion 12A, and the width (a3) of the first semi-cylindrical lens portion 11B is 1.2 times the width (a2) of the first semi-cylindrical lens portion 11A. The dashed line in the graph of FIG. 4 shows the light-intensity-distribution curve of the light emitting device according to the reference example which includes semi-cylindrical lens portions having the same transverse cross-sectional shape, in other words, the height (h) and width (a) of all the semi-cylindrical lens portions 10 are fixed so that the radius of curvature of the semi-cylindrical lens portions 10 is fixed. FIG. 4 shows that the light-intensity-distribution curve sharply rises on the both ends in the parallel arrangement direction of the semi-cylindrical lens portions, and the light intensity is roughly uniform so that the curve is flat from the transverse ends to the central part in the light emitting device according to the reference example. As compared to this, the light-intensity-distribution curve relatively gently rises from the transverse ends toward the central part in the parallel arrangement direction of the semi-cylindrical lens portions (the maximum slope of the light-intensity-distribution curve is reduced), and the curve has its peak around the central part in the light emitting device according to the first embodiment.

The entire transverse cross-sectional shape of the light-transmissive member 3, which includes the semi-cylindrical lens portions 10, is symmetric with respect to the central trough part 7 in the transverse direction. That is, the widths (a1) of the central two second semi-cylindrical lens portion 12A are substantially equal to each other. The widths (a2) of the two first semi-cylindrical lens portions 11A on the right and left sides adjacent to the second semi-cylindrical lens portions 12A are substantially equal to each other. The widths (a3) of the two first semi-cylindrical lens portions 11B on the right and left sides adjacent to the first semi-cylindrical lens portions 11A, that is, the widths of the outermost semi-cylindrical lens portions are substantially equal to each other. In the case where the widths (a) of the semi-cylindrical lens portions 10 are symmetrically dimensioned with respect to the center in the transverse direction, the light-intensity-distribution curve of the light emitting device 100 can be symmetric in the parallel arrangement direction of the semi-cylindrical lens portions 10. According to this arrangement, when the light emitting device 100 is fastened to a mount board, or the like in assembling of a light irradiation apparatus, the light emitting device 100 can be efficiently mounted since it can be arranged irrespective of its right-and-left orientation. In order to provide another desired light distribution property, the widths (a) of the semi-cylindrical lens portions 10 of the light-transmissive member may be asymmetrically dimensioned with respect to the center of the transverse direction.

The material of the light-transmissive member 3 can be resin such as thermosetting or thermoplastic resin, glass, or the like. As for resin, silicone resin, or the like can be used from the viewpoints of durability, ease of shaping, and the like, for example. The light-transmissive member 3 can be formed by compression molding, transfer molding, casting shaping, or the like. For example, the upper surface of the printed board 2 and the light emitting elements 1 placed on the printed board 2 are closed by a die which has recessed parts to form the semi-cylindrical lens portions 10, and a liquefied material is injected into the space defined by the printed board and the die. After that, the light-transmissive member 3 can be formed by curing the material. The light-transmissive member 3 may be formed by drawing lines of a material (e.g., resin) with an adjusted viscosity, and the like as the light-emitting-element rows and the curing the material.

Voids can be prevented in the light-transmissive member 3 by selecting of the uneven conditions of the surface of the printed board 2, and adjusting the viscosity, temperature, injection pressure, and the like of resin when the resin is injected. Specifically, the voids can be reduced by providing a sufficient interval between the light emitting elements 1 on the printed board 2 to improve the flowability of a material of the light-transmissive member 3 to be injected. The flowability of a material of the light-transmissive member 3 can also be improved by wetting the printed board 2 and the light emitting elements 1, which are mounted on the printed board 2, with an organic solvent or the like as pretreatment before injection of a material of the light-transmissive member 3. Methyl ethyl ketone (MEK), or the like can be used as the organic solvent.

(Light Emitting Element 1)

Semiconductor light emitting elements such as light emitting diodes are preferably used as the light emitting elements 1. In particular, semiconductor light emitting elements formed of nitride semiconductor are suitably used. The light emitting element 1 includes semiconductor layers having at least a light-emitting layer, and positive/negative electrodes. For example, $In_xAl_yGa_{1-x-y}N$ ($0 \leq x \leq 1$, $0 \leq y \leq 1$, $x+y \leq 1$), and the like can be used as a material of the light emitting layer. Although light emitting elements which can emit light selected from the range from ultraviolet light to infrared light can be used as the light emitting elements used in this embodiment, light emitting elements which can emit ultraviolet light are suitably used for resin curing and for printing. In this specification, ultraviolet light refers to light having a wavelength falling within the range not longer than 400 nm. In particular, light emitting elements can be suitably used which can emit so-called near-ultraviolet light having a wavelength falling within the range from 330 to 380 nm.

The electrodes are arranged on the upper and lower surfaces of the light emitting element 1. The lower-surface electrode is bonded onto a part of an electrically conductive layer 5 of the printed board 2 by an electrically conductive adhesive, or the like. An example of the electrically conductive adhesive can be provided by solder (e.g., Au—Sn and Au—In). The upper-surface electrode of the light emitting element 1 is connected by an electrically conductive wire 4 to another part of the electrically conductive layer 5 which is located adjacent to the part of the electrically conductive layer 5 onto which the lower-surface electrode is connected. The electrode is formed in the central part of the upper surface of the light emitting element 1. This electrode is connected to the electrically conductive layer 5 by one electrically conductive wire 4. However, the light emitting element 1 is not limited to this. The position of the electrode, the number of the electrodes, and the number of the electrically conductive wires can be suitably modified. The light emitting element may include positive/negative electrodes which are arranged on the same surface side. The same surface side on which the electrodes are arranged can be bonded onto the electrically conductive layer by an electrically conductive adhesive. Alternatively, another surface side opposite to the same surface side on which the electrodes are arranged can be bonded onto the electrically conductive layer by an electrically insulating adhesive, and the electrodes can be electrically connected to the electrically conductive layer by electrically conductive wires.

The light emitting element 1 is a chip-type light emitting diode having a quadrangle dice shape as viewed in plan view. Examples of the quadrangle shape can be provided by square and rectangular shapes. However, the shape of the light emitting element as viewed in plan view is not limited to this. The light emitting element may have a polygonal shape (e.g., hexagonal shape), circular shape, elliptic shape, or the like as viewed in plan view. The size and thickness of the light emitting element 1 can be suitably selected. For example, the light emitting element 1 can have a size of 1.4×1.4 mm as viewed in plan view, and a thickness of 0.3 mm. The dice upper surface of the light emitting element 1 serves as a light emitting surface 1x. A light reflection member 8 surrounds the light emitting surface 1x. The light reflection member 8 is formed on the periphery of the light emitting element 2 by directly covering side surfaces 1y of the dice with a light reflection materials 8a (e.g., white resin). Since the light reflection member 8 can reflect light from the dice side surfaces 1y, the light extracting efficiency of the light emitting element 1 in the optical axis direction can be improved.

Two or more of the light emitting elements 1 are aligned in each of at least three light-emitting-element rows 6. In other words, the light-emitting-element rows 6 are arranged side by side transversely so that the light emitting elements 1 are arranged in the longitudinal and transverse directions. Twelve light emitting elements 1 are aligned in each of the light-emitting-element rows 6. Six light-emitting-element rows 6 are arranged. Totally, the light emitting device 100 includes 72 light emitting elements 1. However, the present invention is not limited to this. The arrangement pattern of the light emitting elements 1, the number of the light emitting elements 1, and the number of the light-emitting-element rows 6 can be suitably modified. The light emitting elements 1 in each of the light-emitting-element rows 6 are spaced at a substantially fixed interval from each other. In the case where the light emitting elements 1 are spaced at a substantially fixed interval from each other, emitted light can be uniform in the direction of the light-emitting-element row 6 so that appearance of light spots can be suppressed. This arrangement of the light emitting elements 1 is preferable also from viewpoint of ease of mounting.

The electrically conductive layer 5 and the electrically conductive wires 4 connect twelve light emitting elements 1 in series to each other, and six light-emitting-element rows in parallel to each other. The connection pattern of the light emitting elements is not limited to this, but can be suitably modified. The alignment direction of the light emitting elements 1 that are connected in series to each other agrees with the extension direction of the semi-cylindrical lens portion 10. According to this, since the connection parts of the electrically conductive wires 4 for connecting the light emitting elements 1 to the electrically conductive layer 5 will not overlap the trough part 7 where the thickness of the light-transmissive member 3 is relatively thin, stress from the outside is unlikely to be applied to the connection parts. Therefore, disconnection of the electrically conductive wires 4 can be suppressed.

The light emitting elements 1 are aligned on a straight line and equally spaced away from each other in the extension direction of the semi-cylindrical lens portion 10. The intervals (d) between the light-emitting-element rows 6, which are arranged side by side transversely, are adjusted in accordance with the widths (a) of the semi-cylindrical lens portions 10, which are arranged on the upper sides of the light-emitting-element rows 6. The center line of the semi-cylindrical lens portion 10 of the light emitting device 100 according to this embodiment is positioned right above its light-emitting-element row 6. Since the lower ends of the semi-cylindrical lens portions 10 having different widths (a) are coupled to each other in the transverse direction in the light-transmissive member 3 for covering the light-emitting-element rows 6, the intervals between the center lines of the semi-cylindrical lens portions 10 are different, and correspondingly the intervals (d) of the light-emitting-element rows 6 are adjusted. Specifically, the intervals (d) become greater from the light-emitting-element rows 6 that are arranged in the central part toward the light-emitting-element rows 6 that are arranged in both end parts since the second semi-cylindrical lens portions 12 are arranged in the central part, and the first semi-cylindrical lens portions 11 are arranged on the both sides of the second semi-cylindrical lens portions 12 in this embodiment.

The intervals (d) between the light-emitting-element rows 6 are dimensioned equal to their corresponding intervals between the center lines of the semi-cylindrical lens portions 10 which face the light-emitting-element rows 6. The width (a1) of the second semi-cylindrical lens portion 12A in the semi-cylindrical lens portions 10 is smaller than the width (a2) of the first semi-cylindrical lens portion 11A, and the width (a3) of the first semi-cylindrical lens portion 11B is greater than the width (a2) of the first semi-cylindrical lens portion 11A. Correspondingly, in the light emitting device 100 according to this embodiment, the interval (d1) between two light-emitting-element rows 6A that face the second semi-cylindrical lens portions 12A is smaller than the interval (d2) between the light-emitting-element row 6A, which faces the second semi-cylindrical lens portion 12A, and the light-emitting-element row 6B which face the first semi-cylindrical lens portion 11A. In addition, the interval (d3) between the light-emitting-element row 6C which faces the first semi-cylindrical lens portion 11B and the light-emitting-element row 6B, which faces the first semi-cylindrical lens portion 11A, is greater than the interval (d2) between the light-emitting-element row 6A, which faces the second semi-cylindrical lens portion 12A, and the light-emitting-element row 6B, which face the first semi-cylindrical lens portion 11k That is, the intervals (d) between the light-emitting-element rows 6 of the light emitting device 100 decrement toward the central part from the exterior sides.

The widths (a1, a2, a3) of the semi-cylindrical lens portions 10 and the intervals (d1, d2, d3) between the light-emitting-element rows 6 are dimensioned $a1<a2<a3$ and $d1<d2<d3$. More specifically, they can be defined as follows:

$$d1=a1$$

$$d2=(a1+a2)/2$$

$$d3=(a2+a3)/2$$

In the case where the intervals (d) between the light-emitting-element rows 6 decrement toward the central part from the exterior sides as discussed above, the intensity of light in the central can be higher than in the both end parts in the parallel arrangement direction of the semi-cylindrical lens portions 10. Since the second semi-cylindrical lens portions 12 are arranged in the central part in the parallel arrangement direction of the semi-cylindrical lens portions 10, the directivity of light is high in the central part. Such high directivity in the central part in synergy with the variation of the interval between the light-emitting-element rows can provide a more ideal light-intensity-distribution curve of the light emitting device in the parallel arrangement direction of the semi-cylindrical lens portions 10.

(Printed Board 2)

The printed board 2 includes an electrically insulating base member 2A, and the electrically conductive layer 5, which is arranged on the base member 2A and can supply electric power to the light emitting elements 1. The printed board 2 can include openings 18 which open on the both longitudinal parts and can receive fasteners 19 for fastening the light emitting device 100 to a mount board. The opening 18 is not limited to an opening completely surrounded by a material of the base member but can be an opening partially surrounded by the base member.

Exemplary materials of the base member 2A can be provided by electrically insulating materials such as ceramic, resin, and glass. In particular, ceramic, which is an inorganic material, is preferably used from the viewpoint of heat dissipation. Particularly, it is preferable that AlN, which has high heat dissipation characteristics, is used as the ceramic.

The material of the electrically conductive layer 5 is not be specifically limited as long as the electrically conductive layer 5 can be electrically connected to the light emitting elements 1. The electrically conductive layer 5 can be any material known in the art. For example, Cu, Ni, Pd, W, Cr, Ti, Al, Ag, Au, or alloys of them can be used. In particular, Cu or Cu alloy is preferably used from the viewpoint of heat dissipation. In addition, Ag, Pt, Sn, Au, Cu, Rd or alloys of them, or oxide may be laminated on the surface of the electrically conductive layer 5. The electrically conductive layer 5 can be formed by metal plating, sputtering and other known methods. Alternatively, the printed board 2 may be formed of a lead frame which is embedded in a base member (e.g., resin).

(Electrically Conductive Wire 4)

The upper-surface electrode of the light emitting element 1 is electrically connected by the electrically conductive wire 4 to a part of the electrically conductive layer 5 which is located adjacent to another part of the electrically conductive layer 5 on which this light emitting element 1 is arranged. The electrically conductive wire 4 is a metal wire, and extends in a certain arc shape. An exemplary material of the electrically conductive wire 4 can be provided by Au.

The light emitting device 100 can include an additional electronic component such as a protection element. Examples of the protection element can be provided by Zener diode, capacitor, and varistor. In particular, in the case where the light emitting device 100 includes a Zener diode as the protection element, the light emitting device 100 can have high driving reliability.

Second Embodiment

Figure 6:
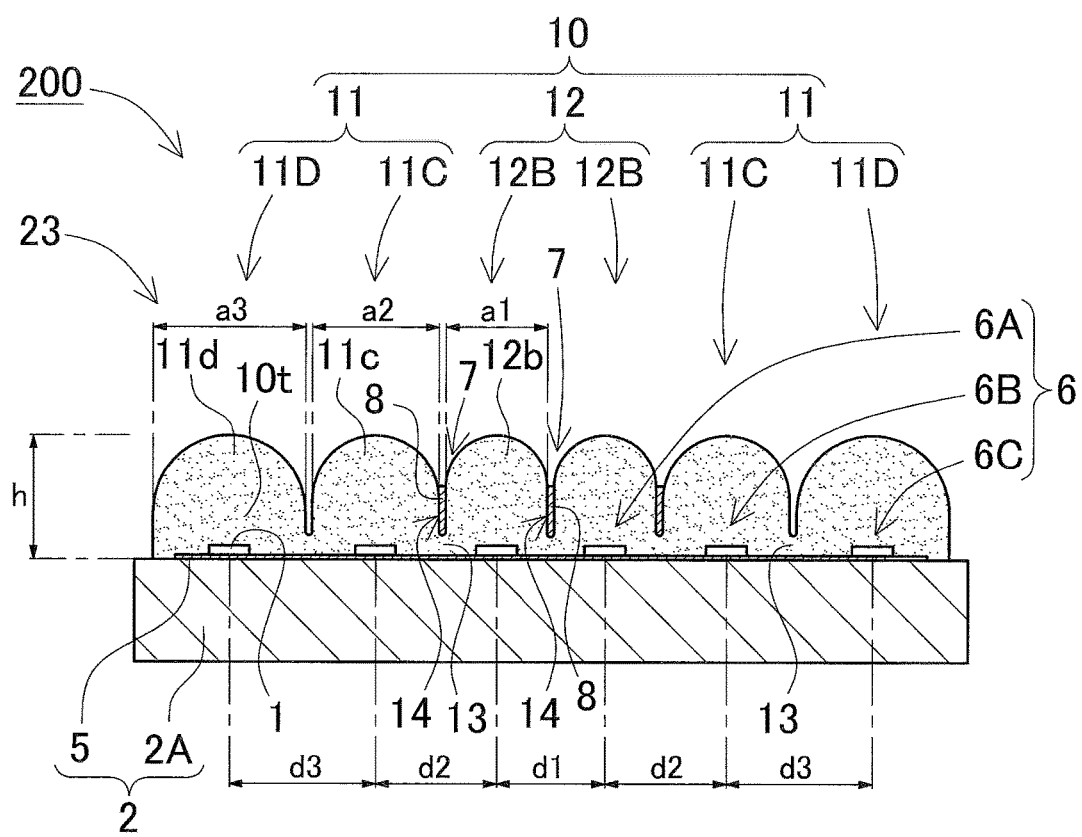
FIG. 6 is a cross-sectional view schematically showing a light emitting device according to a second embodiment.
Figure 7:
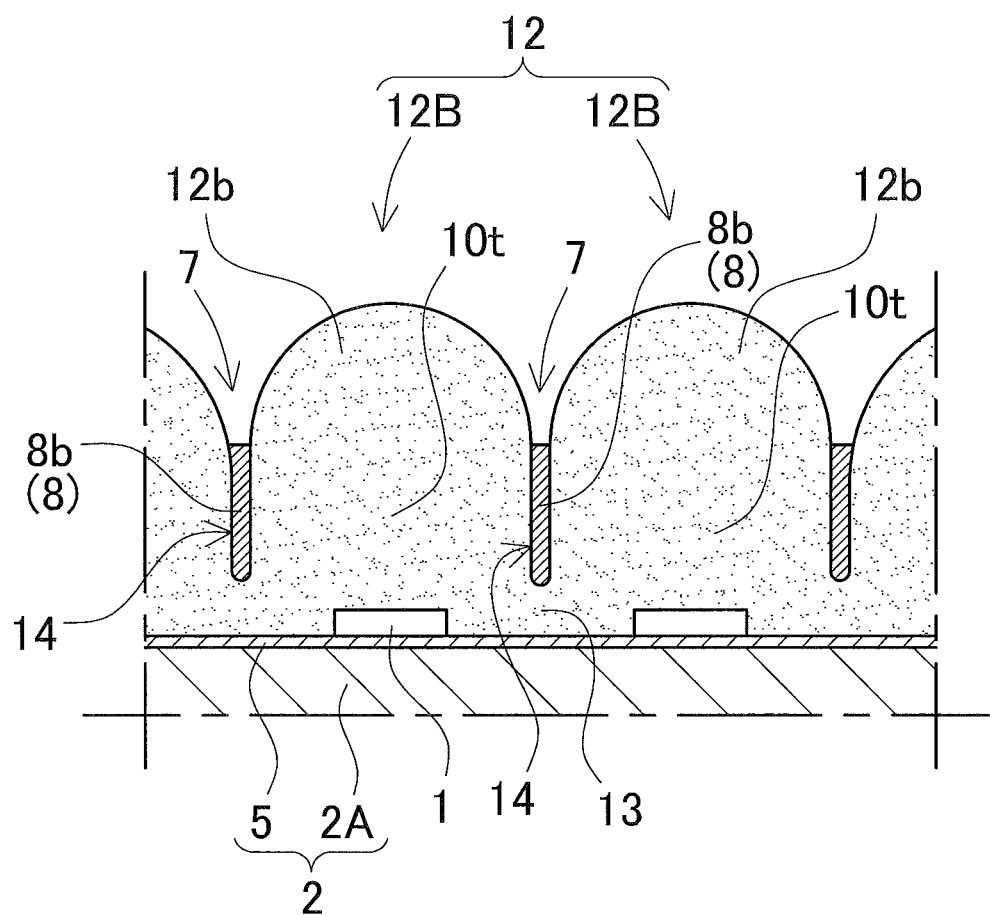
FIG. 7 is a cross-sectional view showing a principal part of the light emitting device shown in FIG. 6.

A light emitting device 200 according to a second embodiment is now described with reference to drawings. FIG. 6 is a cross-sectional view schematically showing the light emitting device 200 according to the second embodiment. FIG. 7 is a cross-sectional view showing a principal part of the light emitting device 200 shown in FIG. 6.

The light emitting device 200 according to the second embodiment includes a light-transmissive member 23 having a shape different from the light-transmissive member 3 according to the first embodiment. The light-transmissive member 23 consists of six semi-cylindrical lens portions 10 which are coupled by the connection parts 13 to each other similar to the light-transmissive member 3 according to the first embodiment. First semi-cylindrical lens portions 11C and 11D are semi-cylindrical lens portions which are arranged to cover the light emitting elements in the both end rows (outermost rows in the parallel arrangement direction of the semi-cylindrical lens portions 10) and the rows (second outermost rows) adjacent to the both end rows (totally in these four rows), and second semi-cylindrical lens portions 12B are semi-cylindrical lens portions which are arranged to cover the light emitting elements in the two central rows, which are located on the interior sides relative to the first semi-cylindrical lens portions 11C and 11D. The first semi-cylindrical lens portions 11C and 11D, and the second semi-cylindrical lens portion 12B have different transverse cross-sectional shapes. The radius of curvature of a curved part 12b on the upper surface side of the second semi-cylindrical lens portion 12B is smaller than the radii of curvature of curved parts 11c and 11d on the upper surface side of the first semi-cylindrical lens portions 11C and 11D. The radius of curvature of the curved part 11c on the upper surface side of the first semi-cylindrical lens portion 11C, which is located close to the central part, is smaller than the curved part 11d on the upper surface side of the first semi-cylindrical lens portion 11D.

The transverse cross-sectional shape of the semi-cylindrical lens portion 10 is a substantially semi-oval shape or substantially semicircular shape the central part of which is bulges upward. The semi-cylindrical lens portion 10 that has a substantially semi-oval shape includes a curved part 11c, 11d or 12b which has a substantially semicircular shape in transverse cross-section, and a prism part 10t which has a fixed width (a) (i.e., the width (a) of the prism part 10t does not vary in the height direction of the semi-cylindrical lens portion 10). The prism parts 10t of the semi-cylindrical lens portion 10 have different widths (a). Correspondingly, the radii of curvature of the curved parts 11c, 11d, and 12b, which have substantially semicircular shapes and are located on their corresponding prism parts 10t, are different. The optical axes of the light emitting elements 1 pass through the center lines of their corresponding curved parts 11c, 11d, and 12b, which have substantially semicircular shapes, of the semi-cylindrical lens portions 10. The shapes of the curved parts 11c, 11d, and 12b are symmetric with respect to the optical axis of the their corresponding light emitting elements 1 which face their corresponding semi-cylindrical lens portions 10 as viewed in transverse cross-section.

The transverse cross-sectional shapes of the semi-cylindrical lens portions 10 of the light-transmissive member 23 are substantially semi-oval. The width (a) of the prism part 10t, which is located on the lower-surface side, of the second semi-cylindrical lens portion 12 is dimensioned small, while the semi-cylindrical lens portions 10 have the fixed height (h). Correspondingly, the radius of curvature of the curved part 12b of the second semi-cylindrical lens portion 12B is dimensioned smaller than the curved parts 11c and 11d of the first semi-cylindrical lens portions 11C and 11D. In other words, the widths (a) of the prism parts 10t are adjusted to different widths while the height (h) of the semi-cylindrical lens portions 10 is fixed so that the radii of curvature of the substantially semicircular curved parts 11c, 11d, and 12b can be adjusted to different radii. Specifically, the width (a1) of the prism part 10t of the second semi-cylindrical lens portion 12B is smaller than the widths (a2, a3) of the prism parts 10t of the first semi-cylindrical lens portions 11C and 11D. That is, the width (a1) of the prism part 10t of the second semi-cylindrical lens portion 12B is the smallest among the semi-cylindrical lens portions 10. Since the width (a1) of the prism part 10t of the second semi-cylindrical lens portion 12B, which is arranged in the central part, is dimensioned the smallest in the light-transmissive member 3, which includes the semi-cylindrical lens portions 10 arranged side by side transversely, in other words, the radius of curvature on the upper surface side of the curved part 12b is dimensioned the smallest, the directivity of light from the central part can be high.

In the light-transmissive member 23 according to this embodiment, the radius of curvature of the curved part 12b on the upper surface side of the two second semi-cylindrical lens portions 12B, which is located in the central part in the parallel arrangement direction of the semi-cylindrical lens portions 10, is the smallest, and the radii of curvature of the curved parts 11c and 11d on the upper surface side increment from the second semi-cylindrical lens portion 12B toward the exterior sides. Since the radii of curvature of the substantially semicircular-shaped curved parts 11d, 11c, and 12b of the light-transmissive member 23 decrement from the exterior sides toward the central part in the parallel arrangement direction of the semi-cylindrical lens portions 10 as viewed in transverse cross-sectional view, the light-intensity-distribution curve relatively gently rises from the exterior sides toward the central part in the parallel arrangement direction of the semi-cylindrical lens portions 10 (the maximum slope of the light-intensity-distribution curve of the light emitting device 200 is reduced).

The entire transverse cross-sectional shape of the light-transmissive member 23, which includes the semi-cylindrical lens portions 10, is symmetric with respect to the central trough part 7 which is located in the central area in the transverse direction. That is, the widths (a1) of the two second semi-cylindrical lens portion 12B in the central part are substantially equal to each other. The widths (a2) of the two first semi-cylindrical lens portions 11C adjacent to the two second semi-cylindrical lens portions 12B are substantially equal to each other. The widths (a3) of the first semi-cylindrical lens portions 11D on the exterior sides of the first semi-cylindrical lens portions 11C, that is, the widths of the outermost semi-cylindrical lens portions 10 are substantially equal to each other.

The intervals (d) between the light-emitting-element rows 6 are dimensioned equal to their corresponding intervals between the center lines of the semi-cylindrical lens portions 10 which face the light-emitting-element rows 6. In the light emitting device 200, the first semi-cylindrical lens portions 11C are arranged on the right and left exterior sides of the two second semi-cylindrical lens portions 12B, which are located in the central part, and the first semi-cylindrical lens portions 11D are arranged on the both exterior sides of the first semi-cylindrical lens portions 11C. The width (a1) of the second semi-cylindrical lens portion 12B in the semi-cylindrical lens portions 10 is smaller than the width (a2) of the first semi-cylindrical lens portion 11C, and the width (a3) of the first semi-cylindrical lens portion 11D is greater than the width (a2) of the first semi-cylindrical lens portion 11C. Correspondingly, in the light emitting device 200 according to this embodiment, the interval (d1) between two light-emitting-element rows 6A that face the second semi-cylindrical lens portions 12B is smaller than the interval (d2) between the light-emitting-element row 6A, which faces the second semi-cylindrical lens portion 12B, and the light-emitting-element row 6B which face the first semi-cylindrical lens portion 11C. In addition, the interval (d3) between the light-emitting-element row 6C which faces the first semi-cylindrical lens portion 11D and the light-emitting-element row 6B, which faces the first semi-cylindrical lens portion 11C, is greater than the interval (d2) between the light-emitting-element row 6A, which faces the second semi-cylindrical lens portion 12B, and the light-emitting-element row 6B, which face the first semi-cylindrical lens portion 11C. That is, the intervals (d) between the light-emitting-element rows 6 of the light emitting device 200 decrement toward the central part from the exterior sides.

The light-transmissive member 23 has narrow grooves 14 which are arranged between the semi-cylindrical lens portions 10 adjacent to each other, more specifically, between the prism parts 10t which face each other. The grooves 14 have a deep recessed shape which extends toward the printed board 2 from the lower ends of the trough parts 7 which are formed between the curved parts 11c, 11d, and 12b of the semi-cylindrical lens portions 10 adjacent to each other. The grooves can increase the directivity of the semi-cylindrical lens portions 12 although the semi-cylindrical lens portions 10 include the prism parts 10t. The reason is that the height of the connection part 13, which is formed between the semi-cylindrical lens portions 10, can be reduced by the groove 14, which is formed between the semi-cylindrical lens portions 10 adjacent to each other, whereby suppressing light leakage into the connection parts 13 and interference between the light-emitting-element rows 6 adjacent to each other.

In addition, light reflection members 8 are formed between the semi-cylindrical lens portions 10 and on the side surfaces of the semi-cylindrical lens portions 10 in order to reflect light emitted by the light emitting elements 1. The light reflection members 8, which are formed on the side surfaces of the semi-cylindrical lens portions 10, can suppress leakage of light from the side surfaces of the semi-cylindrical lens portions 10. As a result, the light extracting efficiency in the optical axis direction can be improved. The grooves 14, which are arranged between the semi-cylindrical lens portions 10 adjacent to each other, are filled with a light reflection material 8b so that the light reflection members 8 are formed on the side surfaces of the prism parts 10t of the semi-cylindrical lens portions 12B of the light-transmissive member 23. The light reflection material 8b can be formed of white paint, paint containing metal powder, metal film, metal foil, metal plate, or the like.

More specifically, the light reflection member 8 is arranged between the second semi-cylindrical lens portions 12 adjacent to each other, or between the first semi-cylindrical lens portion 11 and the second semi-cylindrical lens portion 12 that are adjacent to each other of the light-transmissive member 23. In the case where the light reflection members 8 are arranged on the side surfaces of the second semi-cylindrical lens portions 12B, which are arranged in the central part of the entire arrangement of the semi-cylindrical lens portions 10 but the light reflection member 8 is not arranged on the side surface of the outermost first semi-cylindrical lens portion 11D, light from the light emitting elements 1 can be effectively reflected toward the curved part 12b side by the light reflection members 8 on the second semi-cylindrical lens portions 12B in the central part, and light from the light emitting elements 1 is unlikely to reflect toward the curved part 11d side but is likely to pass through the outermost first semi-cylindrical lens portion 11D. For this reason, the directivity of the second semi-cylindrical lens portions 12B can be higher so that the light distribution of the light emitting device can be more ideal.

In the light emitting devices 100 and 200 according to the aforementioned embodiments, the intervals (d) between the light-emitting-element rows 6 of the light emitting device 100 decrement toward the central part from the exterior sides in the parallel arrangement direction of the semi-cylindrical lens portions 10. In light emitting devices according to other embodiments, the interval between light-emitting-element rows can be fixed. A light emitting device according to an embodiment will be described which includes light-emitting-element rows having a fixed interval.

Third Embodiment

Figure 8:
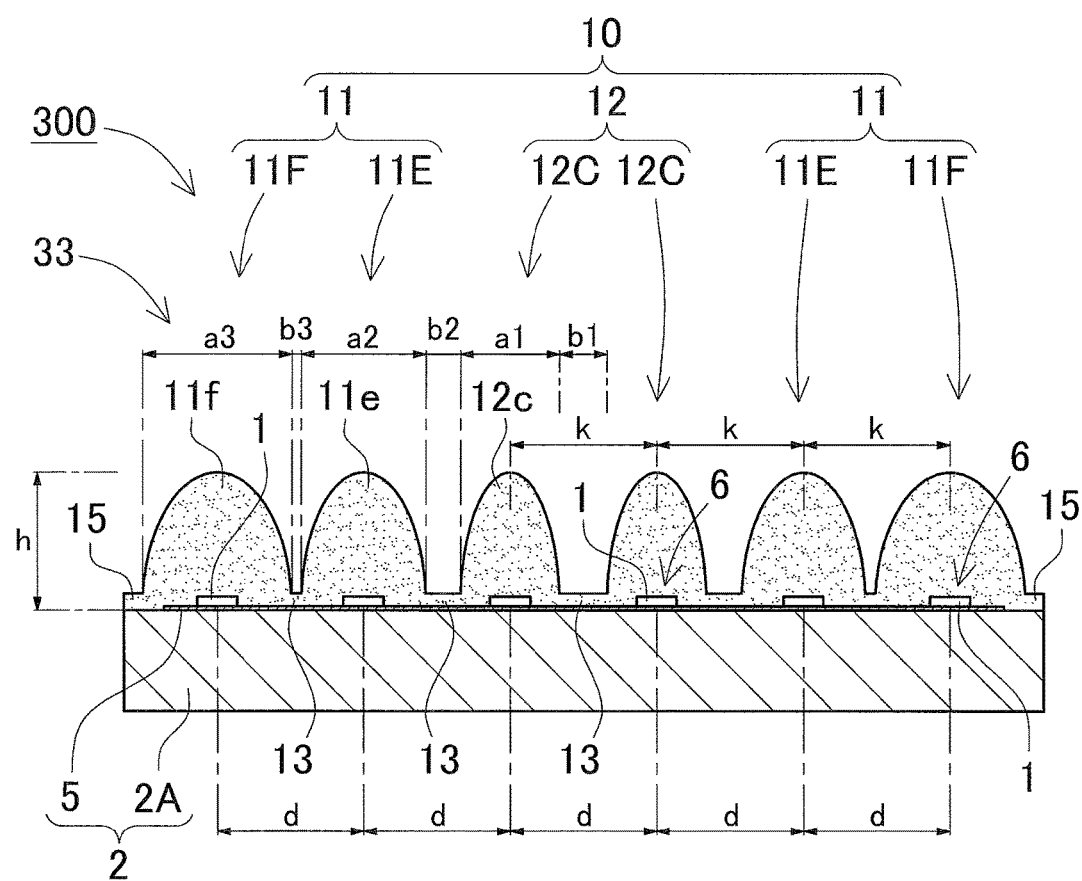
FIG. 8 is a cross-sectional view schematically showing a light emitting device according to a third embodiment.

A light emitting device 300 according to a third embodiment is now described with reference to drawings. FIG. 8 is a cross-sectional view schematically showing the light emitting device 300 according to the third embodiment.

The light emitting device 300 includes the light-emitting-element rows 6 which are arranged on the printed board 2 and are spaced at a fixed interval away from each other, and a light-transmissive member 33 including semi-cylindrical lens portions 10 which are arranged side by side transversely on their corresponding light-emitting-element rows 6. In the case where the light-emitting-element rows 6 are spaced at a substantially fixed interval away from each other, the light emitting elements 1 can be easily mounted. The term "substantially fixed interval" refers to intervals the difference of which falls within the range not greater than 2.0 mm.

In the light emitting device 300 according to the third embodiment, the shapes of the connection parts 13 which connect the lower ends of the semi-cylindrical lens portions 10 to each other are different from the first embodiment, although the number of the semi-cylindrical lens portions 10 of the light-transmissive member 33, and the transverse cross-sectional shapes of the semi-cylindrical lens portions 10 of the light emitting device 300 according to the third embodiment are substantially the same as the semi-cylindrical lens portions 10 illustrated in the first embodiment. The semi-cylindrical lens portions 10 are arranged on the light-emitting-element rows 6, which are spaced at a fixed interval away from each other on the printed board 2, and the center-to-center intervals (k) between the center lines of the semi-cylindrical lens portions 10 adjacent to each other are equal to the fixed interval (d) of the light-emitting-element rows 6 adjacent to each other. The widths (a) of the semi-cylindrical lens portions 10 of the light-transmissive member 33 increment from second semi-cylindrical lens portions 12C in the central part to first semi-cylindrical lens portions 11E and 11F which are located on the exterior sides of the second semi-cylindrical lens portions 12C. It can be seen from FIG. 3 that the intervals a1, a2 and a3 are dimensioned a1<a2<a3. To provide the fixed interval, the widths (b) of the connection parts 13, which connect the lower ends of the semi-cylindrical lens portions 10 to each other, increment from the exterior side semi-cylindrical lens portions 10 toward the central part. It can be also seen from FIG. 3 that the widths b1, b2 and b3 are dimensioned b3<b2<b1. The connection parts 13 transversely (horizontally in FIG. 8) extend, and have a predetermined height with respect to the surface of the printed board 2. The radius of curvature becomes smaller in the order of the curved part 11$f$ on the upper surface side of the first semi-cylindrical lens portion 11F, the curved part 11$e$ on the upper surface side of the first semi-cylindrical lens portion 11E, and the curved part 12$c$ on the upper surface side of the second semi-cylindrical lens portion 12C.

The center-to-center intervals (k) between the semi-cylindrical lens portions 10 adjacent to each other of the light-transmissive member 33 are adjusted to a fixed interval by adjusting the widths (b) of the connection parts 13 to different widths in accordance with different widths (a) on the lower end side of the semi-cylindrical lens portions 10 which are connected to each other by the connection parts 13. According to this arrangement, the tops of the semi-cylindrical lens portions 10 are positioned right above the light-emitting-element rows 6, which are spaced at a fixed interval away from each other, and above the centers of the light emitting surfaces of the light emitting elements 1. The light-transmissive member 33 may include flange parts 15 which extend outward from the lower ends of the semi-cylindrical lens portions 10 that are located on the both sides in the parallel arrangement direction of the semi-cylindrical lens portions 10.

Fourth Embodiment

Figure 9:
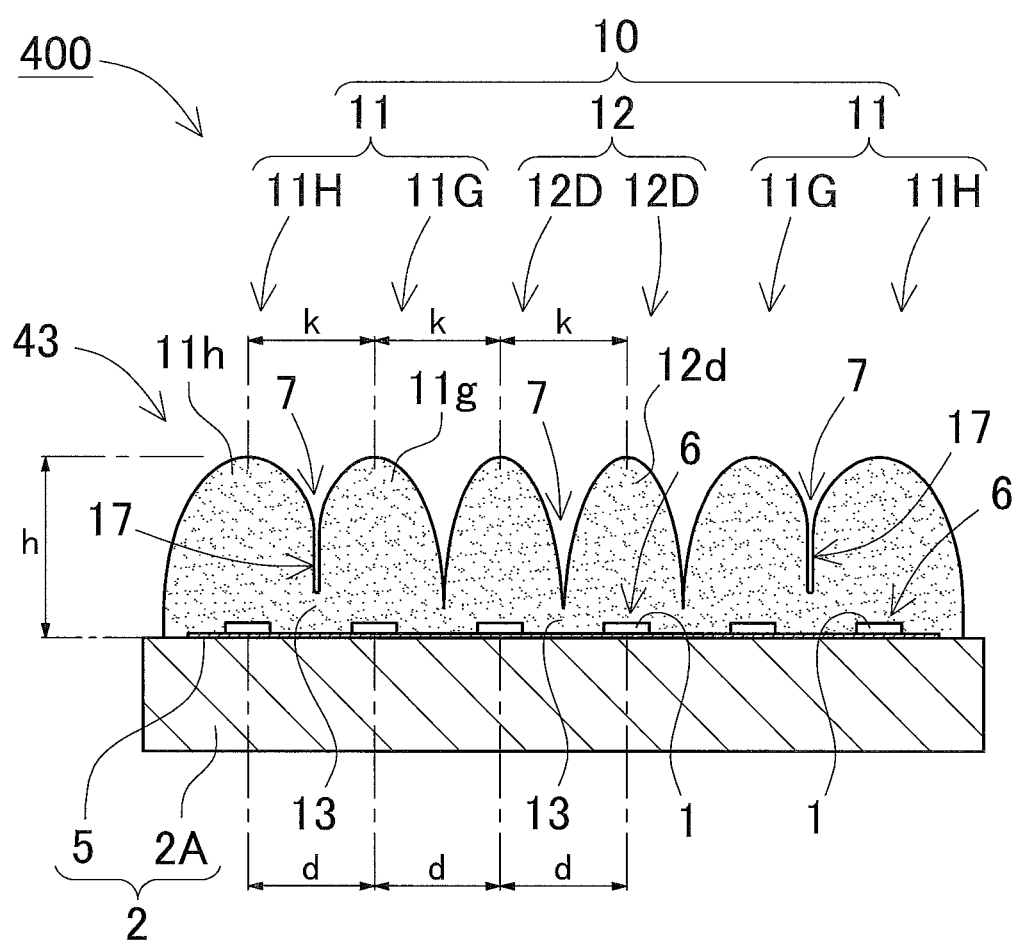
FIG. 9 is a cross-sectional view schematically showing a light emitting device according to a fourth embodiment.

A light emitting device 400 according to a fourth embodiment is now described with reference to drawings. FIG. 9 is a cross-sectional view schematically showing the light emitting device 400 according to the fourth embodiment.

Similar to the third embodiment, the light emitting device 400 according to the fourth embodiment includes the light-emitting-element rows 6 which are arranged on the printed board 2 and are spaced at a fixed interval away from each other, and a light-transmissive member 43 including semi-cylindrical lens portions 10 which are arranged side by side transversely on their corresponding light-emitting-element rows 6.

In order to provide a fixed center-to-center interval (k) between the semi-cylindrical lens portions 10, the transverse cross-sectional shapes of the first semi-cylindrical lens portions 11 of the light emitting device 400 according to the fourth embodiment are different from the first semi-cylindrical lens portions 11 according to the first embodiment, although the number of the semi-cylindrical lens portions 10 of the light-transmissive member 43, and the radii of curvature of the curved parts 11$g$, 11$h$ and 12$d$ on the upper surface side of the semi-cylindrical lens portions 10 of the light emitting device 400 according to the fourth embodiment are substantially the same as the semi-cylindrical lens portions 10 illustrated in the first embodiment.

The light-transmissive member 43 includes the first semi-cylindrical lens portions 11G and 11H which are arranged to cover the light emitting elements in the outermost rows and the second outermost rows (totally outer four rows) in the parallel arrangement direction of the semi-cylindrical lens portions 10. In order to reduce the center-to-center interval (k) between the first semi-cylindrical lens portion 11G and 11H adjacent to each other, the first semi-cylindrical lens portions 11G and 11H have an asymmetric shape with respect to the optical axes of their corresponding light emitting elements 1. Specifically, the lower sections of the curved parts 11$g$ and 11$h$ in the boundary area between the first semi-cylindrical lens portions 11G and 11H adjacent to each other are arranged close to each other so that the center-to-center interval (k) between the first semi-cylindrical lens portion 11G and 11H is small. In this arrangement, the boundary parts of the first semi-cylindrical lens portions 11G and 11H adjacent to each other are connected to each other whereby integrally forming the boundary parts with each other. As a result, the connection parts 13 of the first semi-cylindrical lens portions 11G and 11H are dimensioned higher than the connection part 13 of the second semi-cylindrical lens portion 12D. According to this arrangement, the light emitted by the light emitting elements 1 that face the first semi-cylindrical lens portions 11G and 11H passes through the connection part 13. Accordingly, the effect will be reduced which gathers light that passes through the first semi-cylindrical lens portions 11G and 11H. Therefore, the maximum slope of the light-intensity-distribution curve of the light emitting device can be more effectively reduced in the parallel arrangement direction of the semi-cylindrical lens portions 10. The radius of curvature becomes smaller in the order of the curved part 11$h$ on the upper surface side of the first semi-cylindrical lens portion 11H, the curved part 11$g$ on the upper surface side of the first semi-cylindrical lens portion 11G, and the curved part 12$d$ on the upper surface side of the second semi-cylindrical lens portion 12D.

The light-transmissive member 43 has narrow grooves 17 between the boundary parts of two first semi-cylindrical lens portions 11G and 11H, which are arranged to cover the light emitting elements in exterior-side two rows (outermost row and second outermost row) on the both sides each. The grooves 17 have a deep recessed shape which extends toward the printed board 2 from the lower end of the trough part 7 which is formed between the curved parts 11$g$ and 11$h$ of the first semi-cylindrical lens portions 11G and 11H adjacent to each other. The bottom (depth) of the groove 17 is positioned lower than a line which extends preferably at 30 degrees, more preferably at 20 degrees from the point on the printed board 2 at the center of its corresponding light emitting element 1. In the case where the depth of the groove 17 is adjusted to this, the height of the connection part 13 between the first semi-cylindrical lens portions 11G and 11H can be adjusted to suppress light leakage into the connection parts 13 and interference between the light-emitting-element rows 6 adjacent to each other. In addition, the directivity of light from the first semi-cylindrical lens portions 11G and 11H in the both exterior-side areas can be controlled.

The light emitting device 400 according to the fourth embodiment can be short in entire length in the transverse direction, that is, can be small as compared with the light emitting devices 100 and 300 according to the first and third embodiments although the number of the semi-cylindrical lens portions 10 of the light emitting device 400 is six which is equal to the light emitting devices 100 and 300, while the maximum slope of the light-intensity-distribution curve of the light emitting device can be reduced in the parallel arrangement direction of the semi-cylindrical lens portions 10.

Fifth Embodiment

Figure 10:
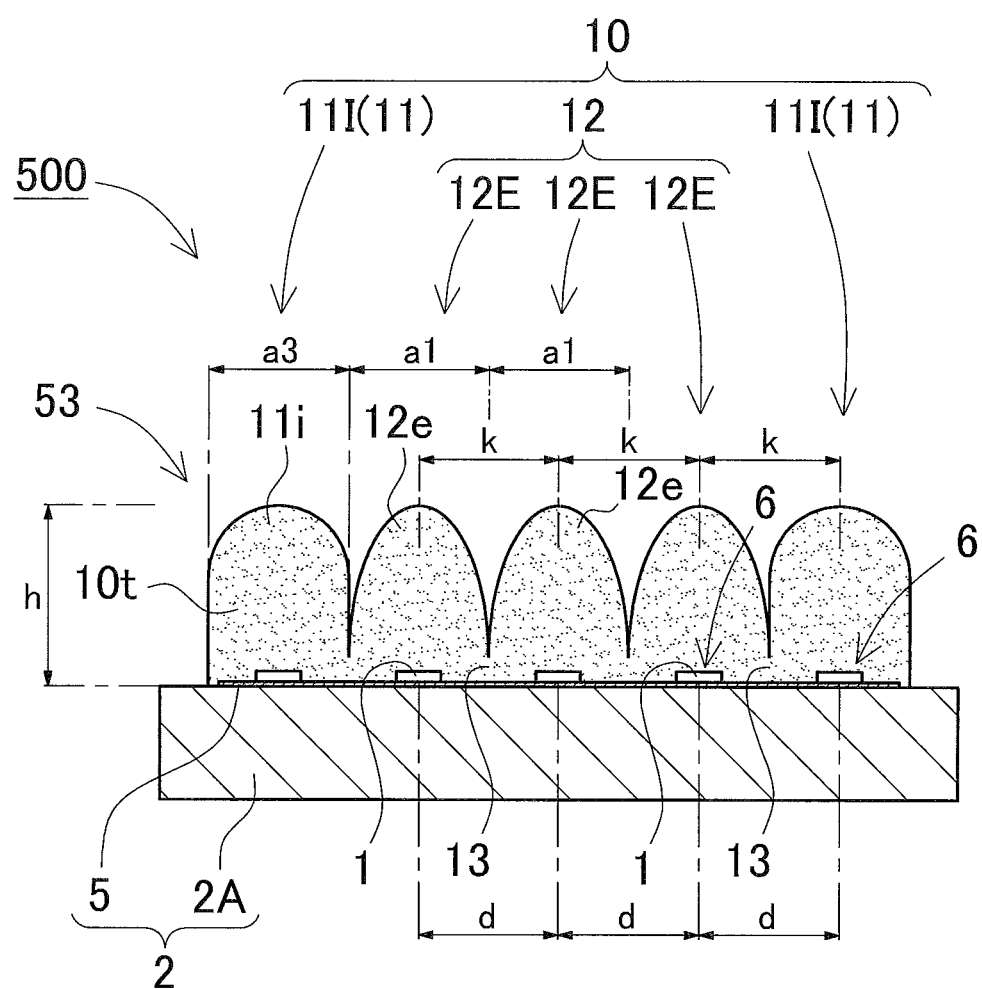
FIG. 10 is a cross-sectional view schematically showing a light emitting device according to a fifth embodiment.

A light emitting device 500 according to a fifth embodiment is now described with reference to drawings. FIG. 10 is a cross-sectional view schematically showing the light emitting device 500 according to the fifth embodiment.

Similar to the third embodiment, the light emitting device 500 according to the fifth embodiment includes the light-emitting-element rows 6 which are arranged on the printed board 2 and are spaced at a fixed interval away from each other, and a light-transmissive member 53 including semi-cylindrical lens portions 10 which are arranged side by side transversely on their corresponding light-emitting-element rows 6.

The light emitting device 500 according to the fifth embodiment includes the light-transmissive member 53 which has a shape different from the light-transmissive member according to the first to fourth embodiments. Specifically, the light-transmissive member 53 of the light emitting device 500 according to the fifth embodiment consists of an odd number (five in this embodiment) of semi-cylindrical lens portions 10. Three of the semi-cylindrical lens portions 10 which are arranged to cover the light emitting elements in the central row and the rows adjacent to the central row in the transverse direction serve as second semi-cylindrical lens portion 12E, and the other two semi-cylindrical lens portions 10 which are arranged to cover the light emitting elements in the rows adjacent to the second semi-cylindrical lens portions 12E (i.e., the outermost rows) serve as first semi-cylindrical lens portions 11*l*. The semi-cylindrical lens portions 10 include a convex curved part 11*i* or 12*e* which bulges upward. The curvature of the curved part 12*e* is smaller than the curved part 11*i*.

The three second semi-cylindrical lens portions 12E in the central part of the light-transmissive member 53 have the same transverse cross-sectional shape as each other. The outermost two first semi-cylindrical lens portions 11*l* have the same transverse cross-sectional shape as each other. Accordingly, the light-transmissive member 53 is symmetric with respect to the center line of the central second semi-cylindrical lens portion 12E which is arranged to cover the light emitting elements in the central row in the transverse direction. Specifically, the second semi-cylindrical lens portion 12E has a substantially semi-elliptic transverse cross-sectional shape, and the first semi-cylindrical lens portion 11*l* has a substantially semi-oval transverse cross-sectional shape. The width (a1) of the substantially semi-elliptic the second semi-cylindrical lens portion 12E of the semi-cylindrical lens portions 10 is equal to the width (a3) of the prism part 10*t* of the substantially semi-elliptic first semi-cylindrical lens portion 11*l*, and the center-to-center interval (k) between the semi-cylindrical lens portions 10 adjacent to each other is fixed. The lower end sides of the five semi-cylindrical lens portions 10 of the light-transmissive member 53 are integrally coupled to each other by the connection parts 13.

The light intensity distribution of the central part of the light emitting device 500 can be increased in a wider central area in the parallel arrangement direction of the semi-cylindrical lens portions 10 by the three second semi-cylindrical lens portions 12E in the central part. In the case where the aforementioned light reflection members are formed on the side surfaces of the central second semi-cylindrical lens portion of the three second semi-cylindrical lens portions, the directivity of the central second semi-cylindrical lens portion can be higher than the other second semi-cylindrical lens portions which are arranged on both sides of this central second semi-cylindrical lens portion.

Sixth Embodiment

Figure 11:
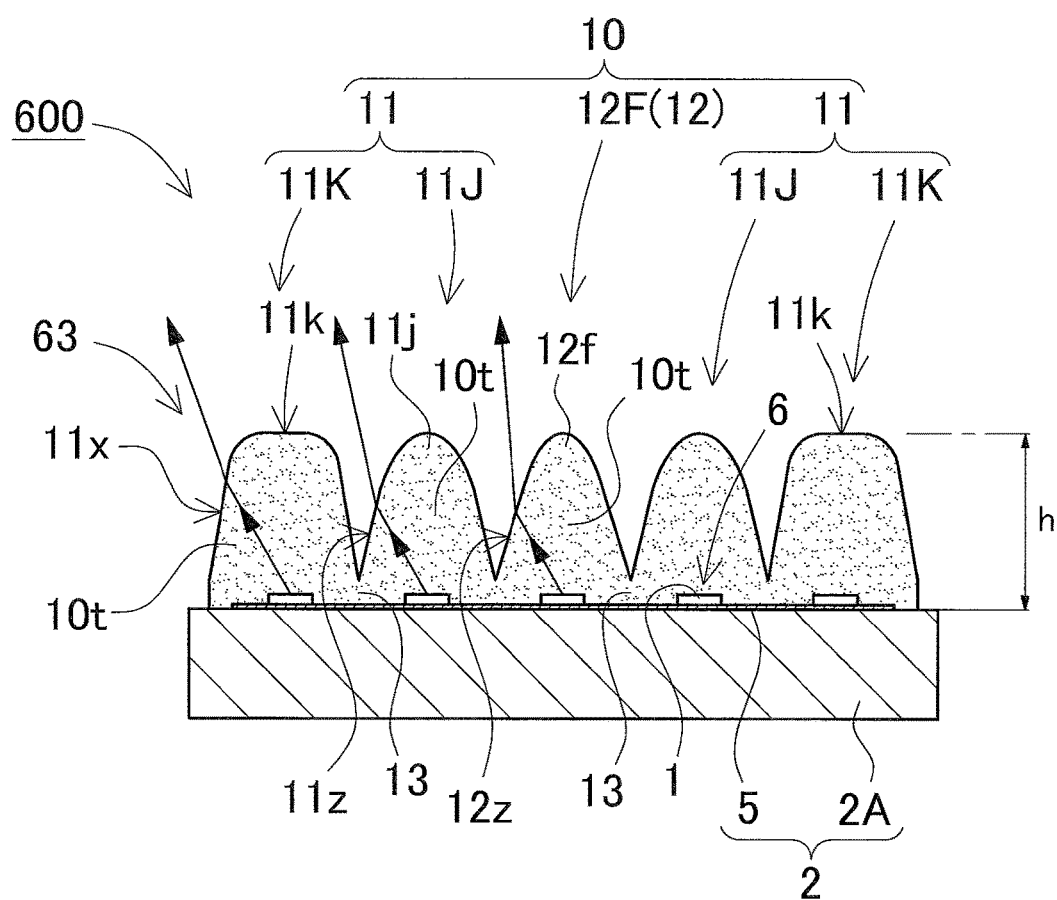
FIG. 11 is a cross-sectional view schematically showing a light emitting device according to a sixth embodiment.

A light emitting device 600 according to a sixth embodiment is now described with reference to drawings. FIG. 11 is a cross-sectional view schematically showing the light emitting device 600 according to the sixth embodiment.

Similar to the third embodiment, the light emitting device 600 according to the sixth embodiment includes the light-emitting-element rows 6 which are arranged on the printed board 2 and are spaced at a fixed interval away from each other, and a light-transmissive member 63 including semi-cylindrical lens portions 10 which are arranged side by side transversely on their corresponding light-emitting-element rows 6.

Specifically, the light-transmissive member 63 of the light emitting device 600 according to the sixth embodiment consists of an odd number (five in this embodiment) of semi-cylindrical lens portions 10. One of the semi-cylindrical lens portions 10 which is arranged to cover the light emitting elements in the central row in the transverse direction serve as a second semi-cylindrical lens portion 12F, and the other four semi-cylindrical lens portions 10 which are arranged to cover the light emitting elements in the two rows on the both side each (i.e., in the two outermost rows and the second outermost rows) serve as first semi-cylindrical lens portions 11J and 11K. The semi-cylindrical lens portions 10 of the light-transmissive member 63 according to the sixth embodiment have transverse cross-sectional shapes different from the transverse cross-sectional shapes of the semi-cylindrical lens portions 10 of the first to fifth embodiments. More specifically, the semi-cylindrical lens portions 10 include a convex curved part 11*j*, 11*k* or 12*f* and a prism part 10*t* which is connected to the lower end of the convex curved part 11*j*, 11*k* or 12*f*. Accordingly, the transverse cross-sectional shape of the semi-cylindrical lens portion 10 is formed by connecting the arc of the convex curved part 11*j*, 11 *k* or 12*f* to the quadrangular transverse cross-sectional of the prism part 10*t*. The convex curved parts 11*j*, 11*k* and 12*f* of semi-cylindrical lens portions 10 bulge upward. The curvature of the curved part 12*f* is smaller than the curved parts 11*j* and 11*k*. The radius of curvature becomes smaller in the order of the curved part 11*k* on the upper surface side of the first semi-cylindrical lens portion 11K, the curved part 11*j* on the upper surface side of the first semi-cylindrical lens portion 11J, and the curved part 12*f* on the upper surface side of the second semi-cylindrical lens portion 12F.

The transverse cross-sectional shapes of the prism parts 10*t* of the semi-cylindrical lens portions 10 are isosceles trapezoidal shapes the width of which decreases upward. The side surface of the prism part 10t serves as inclined surfaces 11z, 11x or 12z. The inclination angles of the inclined surfaces 11z, 11x, and 12z of the prism parts 10t of the semi-cylindrical lens portions 10 (inclination angle with respect to the surface of the printed board 2) become greater in the order of the inclination angle 12z of the second semi-cylindrical lens portion 12F which is arranged to cover the light emitting elements in the central row, the inclination angle 11z of the first semi-cylindrical lens portions 11J which are on the both exterior sides relative to the second semi-cylindrical lens portion 12F, and the inclination angle 11x of the outermost first semi-cylindrical lens portions 11K. According to this arrangement, the widths on the upper end side of the isosceles trapezoidal prism parts 10t become smaller from the exterior sides toward the center in the parallel arrangement direction of the semi-cylindrical lens portions 10, and the radii of curvature of the curved parts 11k, 11j and 12f, which are connected to the tops of the prism parts 10t, become smaller from the exterior sides toward the center. Since the inclination angles of the inclined surfaces 11x, 11z, and 12z of the prism parts 10t of the semi-cylindrical lens portions 10 become smaller from the exterior sides toward the center in the parallel arrangement direction of the semi-cylindrical lens portions 10, the effect of gathering light refracted by the inclined surface 12z can be increased in the central area as compared with the exterior sides.

The curved parts 11k are arranged on the upper end side of the first semi-cylindrical lens portions 11K which are positioned on the both sides in the parallel arrangement direction of the semi-cylindrical lens portions 10. Although the curved parts 11k have a flat section on their upper surfaces, they are referred to as curved parts for ease of explanation. In the case where the curved parts 11k of the semi-cylindrical lens portions 10 have a flat section on their upper surface, light from the flat section can be diffused. As a result, the maximum slope of the light-intensity-distribution curve of the light emitting device can be further reduced. The curved part 11k of the first semi-cylindrical lens portion 11K can have such a flat section on the upper end side. In this case, the radius of curvature of the curved part 11k of the first semi-cylindrical lens portion 11K can be defined as an average value which is calculated from the ratio of the height of the curved part 11k to the width of the lower end side of the curved part 11k.

Seventh Embodiment

Figure 12:
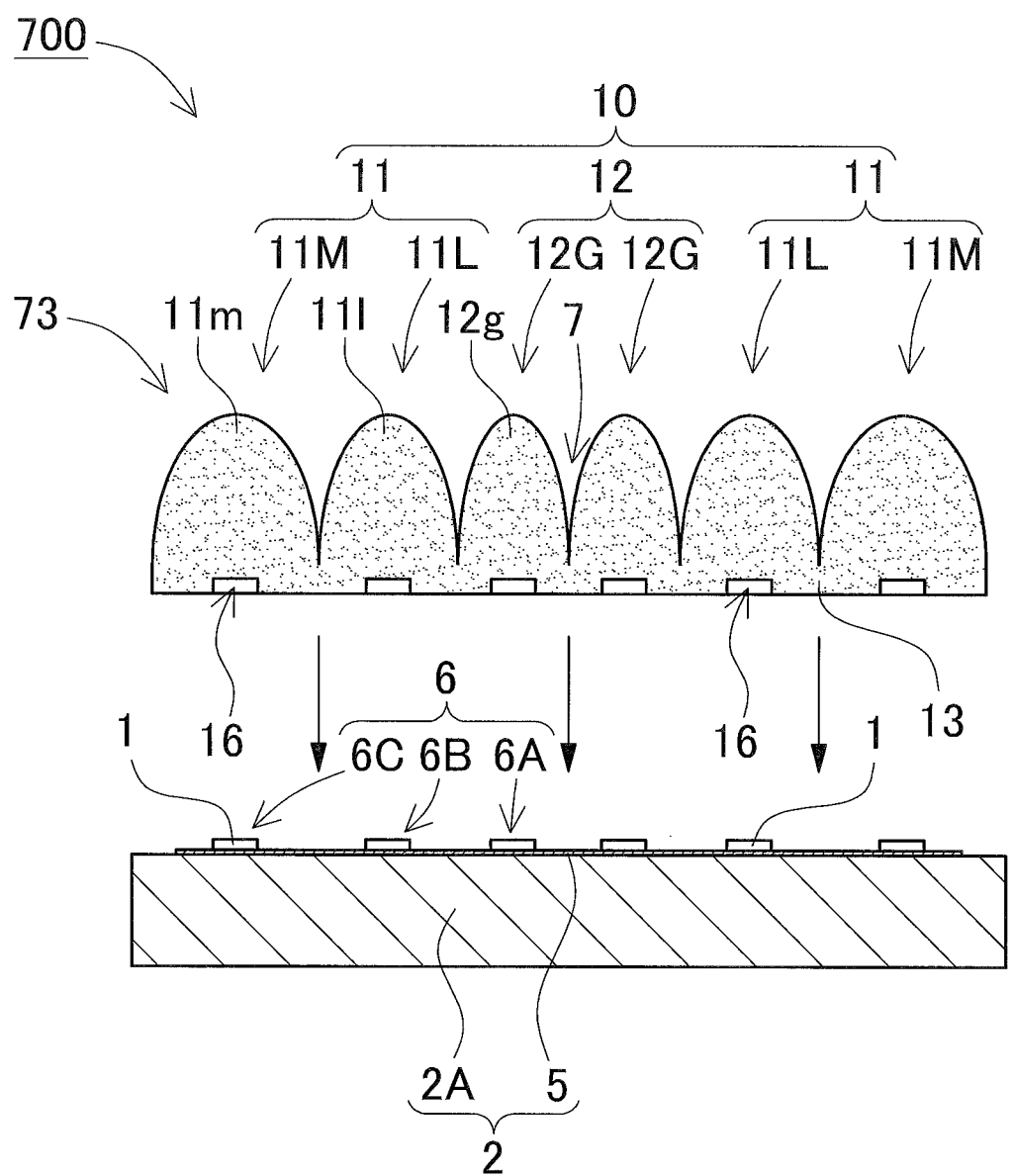
FIG. 12 is a cross-sectional view schematically showing a light emitting device according to a seventh embodiment.

A light emitting device 700 according to a seventh embodiment is now described with reference to drawings. FIG. 12 is a cross-sectional view schematically showing the light emitting device 700 according to the seventh embodiment.

Although the light-transmissive members have been described to directly cover the light emitting elements 1 on the printed board 2 in the first to sixth embodiment, the present invention is not limited to this. In the seventh embodiment, space is provided between a light-transmissive member 73 and the light emitting elements 1. The light-transmissive member 73 consists of an even number (six in this embodiment) of semi-cylindrical lens portions 10. Two of the semi-cylindrical lens portions 10 which are arranged to cover the light emitting elements in the central rows in the transverse direction serve as second semi-cylindrical lens portions 12G. Another two of the semi-cylindrical lens portions 10 which are arranged to cover the light emitting elements in one row adjacent to the second semi-cylindrical lens portion 12G on the both sides each (i.e., the two second outermost rows) serve as first semi-cylindrical lens portions 11L, and the other two semi-cylindrical lens portions 10, which are arranged in one row adjacent to the first semi-cylindrical lens portion 11L on the both sides each (i.e., the two outermost rows), serve as first semi-cylindrical lens portions 11M. The radius of curvature becomes smaller in the order of the curved part 11m on the upper surface side of the first semi-cylindrical lens portion 11M, the curved part 11l on the upper surface side of the first semi-cylindrical lens portion 11L, and the curved part 12g on the upper surface side of the second semi-cylindrical lens portion 12G. The light-transmissive member 73 for covering the light emitting elements 1 can be formed by molding (e.g., by using a die). For example, the light-transmissive member 73 is previously prepared which has recessed parts 16 on its lower surface. The recessed parts 16 can accommodate their corresponding light emitting elements 1. The light-transmissive member 73 is then attached onto the printed board 2 so that the light emitting elements 1 on the printed board 2 can be accommodated in the recessed parts 16. Since this light-transmissive member 73 provides the space so that the light emitting elements 1 are spaced away from the light-transmissive member 73, deterioration of the light-transmissive member 73 caused by light and heat from the light emitting elements 1 can be suppressed. In addition, since the light-transmissive member 73 is prepared previously and then attached onto the printed board 2, when heat is applied to the printed board 2 or the light emitting elements 1 the influence of the heat on the light-transmissive member 73 can be reduced as compared with the case where the light-transmissive member is directly formed on the printed board on which the light emitting elements have been mounted. The light-transmissive member 73 can be fastened to the printed board 2 by adhesion, or the like after previously formed into the predetermined shape. A plurality of light emitting elements are arranged in each row 6. The light emission peak wavelength may become longer in the order of the light emitting elements in rows 6A which are arranged in the second semi-cylindrical lens portions 12G, the light emitting elements in rows 6B which are arranged in the first semi-cylindrical lens portions 11L, and the light emitting elements in rows 6C which are arranged in the first semi-cylindrical lens portions 11M.

Eighth Embodiment

Figure 13:
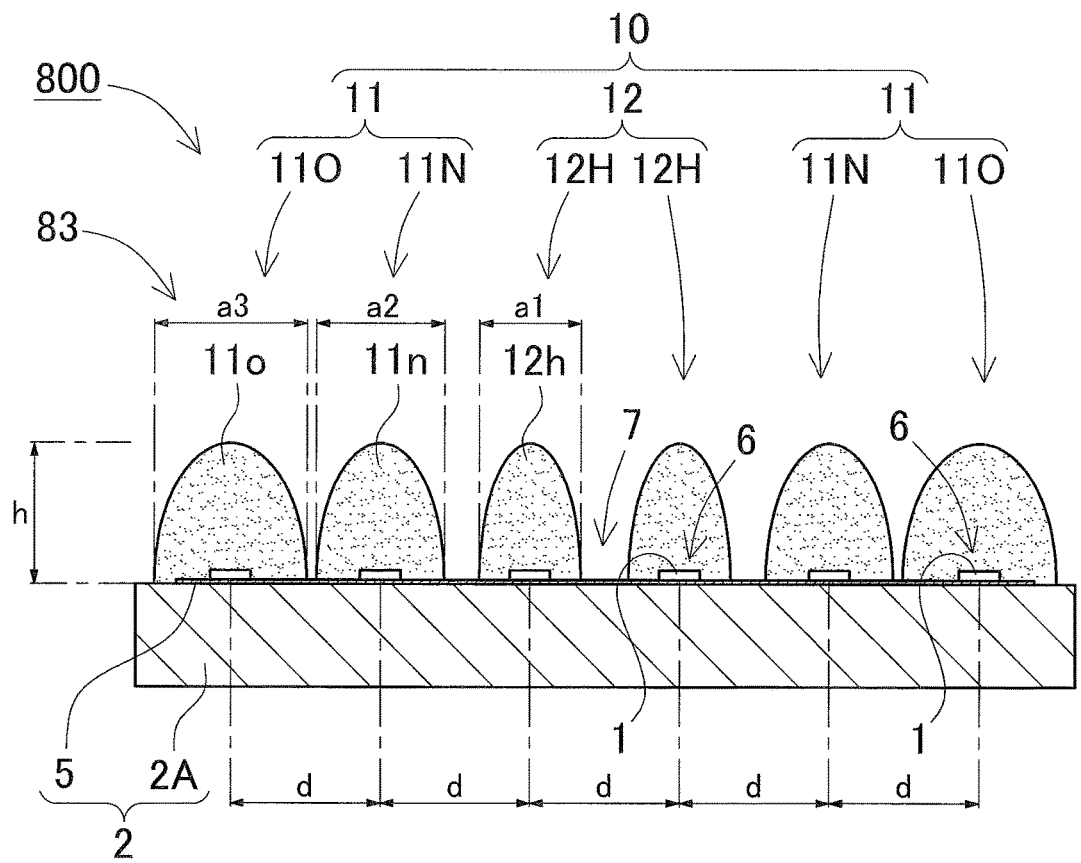
FIG. 13 is a cross-sectional view schematically showing a light emitting device according to an eighth embodiment.

A light emitting device 800 according to an eighth embodiment is now described with reference to drawings. FIG. 13 is a cross-sectional view schematically showing the light emitting device 800 according to the eighth embodiment.

A light-transmissive member 83 of the light emitting device 800 includes semi-cylindrical lens portions 10 which are arranged side by side transversely but separated from each other. In other words, the light-transmissive member 83 does not include the connection parts. Specifically, the semi-cylindrical lens portions 10 of the light emitting device 800 have a convex curved part 11n, 11o or 12h on the upper surface side, and are independently arranged on the printed board 2. The light-transmissive member 73 consists of an even number (six in this embodiment) of semi-cylindrical lens portions 10. Two of the semi-cylindrical lens portions 10 which are arranged to cover the light emitting elements in the central two rows in the transverse direction serve as second semi-cylindrical lens portions 12H. Another two of the semi-cylindrical lens portions 10 which are arranged in one row adjacent to the second semi-cylindrical lens portion 12H on the both sides each (i.e., the two second outermost rows) serve as first semi-cylindrical lens portions 11N, and the other two semi-cylindrical lens portions 10, which are arranged to cover the light emitting elements in one row adjacent to the first semi-cylindrical lens portion 11N on the both sides each (i.e., the two outermost rows), serve as first semi-cylindrical lens portions 11O. The radius of curvature becomes smaller in the order of the curved part 11o on the upper surface side of the first semi-cylindrical lens portion 11O, the curved part 11n on the upper surface side of the first semi-cylindrical lens portion 11N, and the curved part 12h on the upper surface side of the second semi-cylindrical lens portion 12H. The transverse cross-sectional shapes of the semi-cylindrical lens portions 10 are substantially semi-elliptic shapes having a fixed height (h). The widths (a) on the lower end side of the transverse cross-sectional shapes of the semi-cylindrical lens portions 10 become smaller from the exterior sides toward the central part in the transverse direction.

The semi-cylindrical lens portions 10 are symmetrically arranged with respect to the center line between the two second semi-cylindrical lens portions 12H which are arranged to cover the light emitting elements in the central two rows in the transverse direction as viewed in transverse cross-section. That is, the transverse cross-sectional shapes of the second semi-cylindrical lens portions 12H which are arranged to cover the light emitting elements in the central two rows are substantially equal to each other. The transverse cross-sectional shapes of the first semi-cylindrical lens portions 11N which are arranged to cover the light emitting elements in the two rows on the right and left sides adjacent to the second semi-cylindrical lens portions 12H are substantially equal to each other. The transverse cross-sectional shapes of the first semi-cylindrical lens portions 11O (the outermost semi-cylindrical lens portions) which are arranged to cover the light emitting elements in the two rows on the right and left sides adjacent to these first semi-cylindrical lens portions 11N are substantially equal to each other. The light emitting device 800 includes the light-emitting-element rows 6 which are arranged on the printed board 2 and are spaced at a fixed interval away from each other. The semi-cylindrical lens portions 10 are arranged side by side transversely to cover their corresponding light-emitting-element rows 6.

According to this arrangement, since the semi-cylindrical lens portions 10 are spaced away from and arranged side by side transversely, valleys can be provided in the light-intensity-distribution curve of the light emitting device while the maximum slope of the light-intensity-distribution curve of the light emitting device 800 in the parallel arrangement direction of the semi-cylindrical lens portions 10 can be reduced.

Although the light-emitting-element rows 6 on the printed board 2 in the light emitting device 800 are spaced at a fixed interval away from each other, the intervals (d) between the light-emitting-element rows can become smaller toward the central part. In this case, the intervals (d) can be dimensioned depending on the widths (a) of the semi-cylindrical lens portions 10 which are independently formed on the printed board 2.

Although the light emitting devices have been described to include light-transmissive member including six semi-cylindrical lens portions which include the second semi-cylindrical lens portions 12 which are arranged on the right and left sides of the central trough part, or five semi-cylindrical lens portions which include the second semi-cylindrical lens portion 12 which is arranged to cover the light emitting elements in the central row or the second semi-cylindrical lens portions 12 which are arranged to cover the light emitting elements in the central row and the rows on the right and left sides of the central row (totally three rows) in the foregoing first to eighth embodiments, the number of the semi-cylindrical lens portion is not be limited as long as not smaller than three. For example, in the case where the light-transmissive member includes six semi-cylindrical lens portions, the second semi-cylindrical lens portions 12 can be arranged to cover the light emitting elements in the central rows and the rows on the right and left sides of the central rows (totally four rows).

(Light Irradiation Apparatus)

Figure 14:
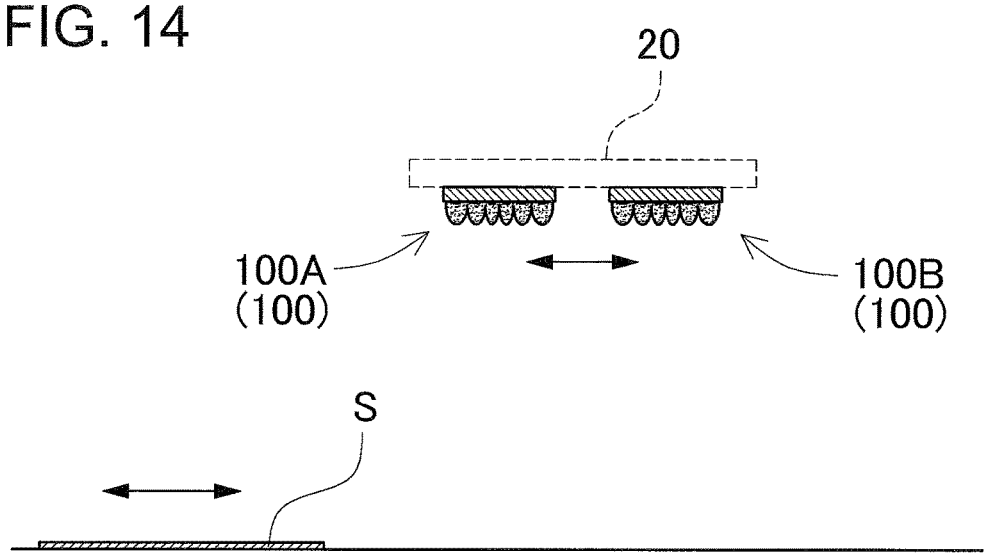
FIG. 14 is a block diagram schematically showing a light irradiation apparatus which includes the light emitting devices.

A plurality of light emitting devices which are discussed above can be arranged transversely in a predetermined arrangement and used as a light irradiation apparatus. FIG. 14 is a block diagram schematically showing a light irradiation apparatus which includes the light emitting devices. The light emitting devices are mounted on a mount board 20, or the like of the light irradiation apparatus. The mount board can be moved in either direction indicated by the arrow shown under the light emitting devices (right and left directions in FIG. 13). Also, a target object S can be moved in either direction indicated by the arrow shown above the target object S. The light emitting devices or the target object S may be moved in the light irradiation apparatus. Alternatively, both the light emitting devices and the target object S may be moved.

Specifically, the light irradiation apparatus includes two light emitting devices 100. The light emitting devices 100 are arranged so that the extension (longitudinal) directions of their semi-cylindrical lens portions 10 are parallel to each other (in other words, their parallel arrangement directions of the semi-cylindrical lens portions 10 of the light emitting devices 100 agree with each other). The two light emitting devices 100 of the light irradiation apparatus face downward. Accordingly, light emitted by the light emitting devices 100 travels downward. In this light irradiation apparatus, the relative movement direction between the light emitting devices 100 and the target object S is parallel to the parallel arrangement direction of the semi-cylindrical lens portions (the transverse direction of the light emitting devices).

The light irradiation apparatus which includes the light emitting devices including the aforementioned semi-cylindrical lens portions can smoothly distribute the intensity of light with which the target object is irradiated. Since the aforementioned light emitting devices are arranged transversely, the target object can be irradiated with light with smoothly rising intensity distribution. As a result, ink, or the like can be reliably cured, for example.

The light emitting elements of one of the light emitting devices 100 of the light irradiation apparatus may emit light with a wavelength different from another light emitting device. For example, the light wavelength of the light emitting elements 1 in a first light emitting device 100A of the two light emitting devices 100 can fall within the range from 290 to 330 nm, and the light wavelength of the light emitting elements 1 in a second light emitting device 100B can fall within the range from 345 to 430 nm. Here, the first light emitting device 100A is arranged at the first position (upstream side) where the target object S is firstly irradiated with light, and the second light emitting device 100B is arranged at the second position (downstream side) where the target object S is irradiated with light after the first light emitting device 100A. More specifically, the light wavelength of the light emitting elements 1 that are arranged in the first light emitting device 100A can be 310 nm, and the light wavelength of the light emitting elements 1 that are arranged in the second light emitting device 100B can be 365 nm. In this case, the light of the first light emitting device 100A can firstly cure the inside of the target object S, more specifically, ink, and subsequently the light of the second light emitting device 100B can relatively slowly cure the surface of the ink. Therefore, this light irradiation apparatus can more surely cure the ink.

Although the two light emitting devices 100 of the light irradiation apparatus have been described to include the light emitting devices 100 which are arranged so that their parallel arrangement directions of the semi-cylindrical lens portions 10 agree with each other, the number of the light emitting devices which are arranged in the transverse direction may be one, or not smaller than two. That is, the number of the light emitting devices, which are arranged in the parallel arrangement (transverse) direction of the semi-cylindrical lens portions, of the light irradiation apparatus can be suitably modified depending on the desired light distribution, the size of a target object S, and the like. The light emitting devices of the light irradiation apparatus can be arranged not only in the parallel arrangement direction of the semi-cylindrical lens portions but also in the extension direction of the semi-cylindrical lens portion.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting device comprising:
   a printed board;
   light emitting elements that are arranged in three or more light-emitting-element rows and mounted on said printed board; and
   a light-transmissive member that includes three or more semi-cylindrical lens portions that are arranged side by side transversely to cover the three or more light-emitting-element rows, and have a convex shape as viewed in transverse cross-section and a substantially fixed height, the semi-cylindrical lens portions including first semi-cylindrical lens portions which are arranged to cover the light emitting elements at least in the both end rows, and a second semi-cylindrical lens portion(s) which is/are arranged on the interior sides relative to said first semi-cylindrical lens portions in the transverse direction and has/have a radius of curvature smaller than said first semi-cylindrical lens portions.

2. The light emitting device according to claim 1, wherein said second semi-cylindrical lens portion(s) is/are arranged to cover the light emitting elements in the row(s) in the central part in the transverse direction.

3. The light emitting device according to claim 1, wherein the number of said semi-cylindrical lens portions is an odd number not smaller than five,
   wherein said second semi-cylindrical lens portions are arranged to cover the light emitting elements in the central row and the rows adjacent to the central row in the transverse direction.

4. The light emitting device according to claim 1, wherein the number of said semi-cylindrical lens portions is an even number not smaller than six,
   wherein said second semi-cylindrical lens portions are arranged to cover the light emitting elements in the central two rows and the rows adjacent to the central two rows in the transverse direction.

5. The light emitting device according to claim 1, wherein said semi-cylindrical lens portions has a transverse cross-sectional shape symmetric with respect to the optical axes of the light emitting elements which face their corresponding semi-cylindrical lens portions.

6. The light emitting device according to claim 1, wherein the radii of curvature of said semi-cylindrical lens portions increment from said second semi-cylindrical lens portion toward the exterior sides in the transverse direction.

7. The light emitting device according to claim 1, wherein the entire transverse cross-sectional shape of said semi-cylindrical lens portions is symmetric with respect to the center line in the transverse direction.

8. The light emitting device according to claim 1, wherein the transverse cross-sectional shapes of said semi-cylindrical lens portions are substantially semi-elliptic shapes, and the width on the lower surface side of the said second semi-cylindrical lens portion is smaller than said first semi-cylindrical lens portion.

9. The light emitting device according to claim 8, wherein the widths on the lower surface side of said semi-cylindrical lens portions are symmetrically distributed with respect to the center line in the transverse direction of said semi-cylindrical lens portion.

10. The light emitting device according to claim 1, wherein said second semi-cylindrical lens portion(s) is/are arranged to cover the light emitting elements in the central row(s) in the transverse direction,
    wherein the intervals between said light-emitting-element rows decrement from the exterior sides toward the central row(s).

11. The light emitting device according to claim 1, wherein the intervals between said light-emitting-element rows are substantially equal to each other.

12. The light emitting device according to claim 1, wherein the light emitting elements in each of said light-emitting-element rows are spaced at a substantially fixed interval from each other.

13. The light emitting device according to claim 1, wherein the lower end side of the semi-cylindrical lens portions adjacent to each other are connected to each other by a connection part.

14. The light emitting device according to claim 1, wherein the semi-cylindrical lens portions are separated from each other.

15. The light emitting device according to claim 1, wherein the upper surfaces of said light emitting elements serve as light emitting surfaces, and light reflection members are arranged around said light emitting surfaces.

16. The light emitting device according to claim 1, wherein said light emitting elements can emit ultraviolet light.

17. A light irradiation apparatus comprising a plurality of light emitting devices according to claim 1 whereby irradiating a target object with light which is emitted by said light emitting devices,
    wherein said light emitting devices are arranged in the transverse direction, wherein the relative movement direction between said plurality of light emitting devices and the target object is parallel to the transverse direction.

18. The light irradiation apparatus according to claim 17, wherein the light emitting elements of one of said light emitting devices can emit light with a wavelength different from another light emitting device.

19. The light irradiation apparatus according to claim 18, wherein said light emitting devices includes a first light emitting device that is arranged on the upstream side whereby firstly irradiating the target object with its light, and a second light emitting device that is arranged on the downstream side relative to said first light emitting device whereby irradiating the target object with its light after said first light emitting device,
   wherein the light wavelength of said light emitting elements that are mounted on said first light emitting device falls within the range from 290 to 330 nm, and the light wavelength of said light emitting elements that are mounted on said second light emitting device falls within the range from 345 to 385 nm.

* * * * *